(12) United States Patent
Oshima

(10) Patent No.: US 8,643,801 B2
(45) Date of Patent: Feb. 4, 2014

(54) DISPLAY DEVICE AND ELECTRONIC APPARATUS INCLUDING THE SAME

(75) Inventor: Yoshihiro Oshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 172 days.

(21) Appl. No.: 13/400,828

(22) Filed: Feb. 21, 2012

(65) Prior Publication Data

US 2012/0218495 A1 Aug. 30, 2012

(30) Foreign Application Priority Data

Feb. 28, 2011 (JP) ................. 2011-042108

(51) Int. Cl.
*G02F 1/136* (2006.01)
(52) U.S. Cl.
USPC .............................................. 349/47; 349/43
(58) Field of Classification Search
USPC ...................................................... 349/47, 43
See application file for complete search history.

(56) References Cited

U.S. PATENT DOCUMENTS 7,184,113 B2 * 2/2007 Baek ............................ 349/114
2012/0001167 A1 * 1/2012 Morosawa ..................... 257/43

FOREIGN PATENT DOCUMENTS

JP 2007-220817 A 8/2007

OTHER PUBLICATIONS

Park, Jaechul et al., "Self-Aligned Top-Gate Amorphous Gallium Indium Zinc Oxide Thin Film Transistors", Applied Physics Letters, 2008, pp. 053501-1 to 053501-3, vol. 93, American Institute of Physics, Republic of Korea.
Hayashi, Ryo et al., "42.1 Invited Paper: Improved Amorphous In—Ga—Zn—O TFTs" for SID 08 Digest, 2008, pp. 621-624, Canon Inc., Tokyo.

* cited by examiner

*Primary Examiner* — Wen-Ying P Chen
(74) *Attorney, Agent, or Firm* — Wolf, Greenfield & Sacks, P.C.

(57) ABSTRACT

A display device includes a substrate; a display element; a thin film transistor, and having a first semiconductor oxide film including a source region and a drain region, the first semiconductor oxide film having first low resistance areas each of whose oxygen concentration is lower than that of the channel region in parts of the source region and the drain region in a depth direction from upper surfaces thereof; a second semiconductor oxide film having a second low resistance area whose oxygen concentration is lower than that of the channel region in a part in the depth direction from the upper surface; and a high resistance film covering the thin film transistor, the second semiconductor oxide film, and the substrate, made of a metallic oxide, having a first translucent area in an area contacting the first low resistance area, and having a second translucent area.

7 Claims, 17 Drawing Sheets

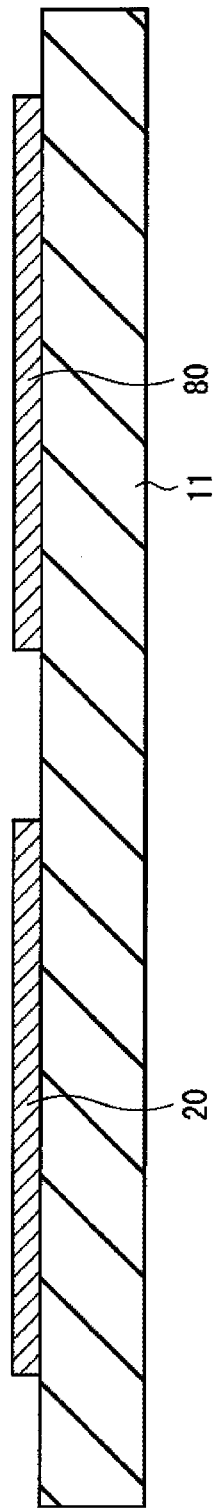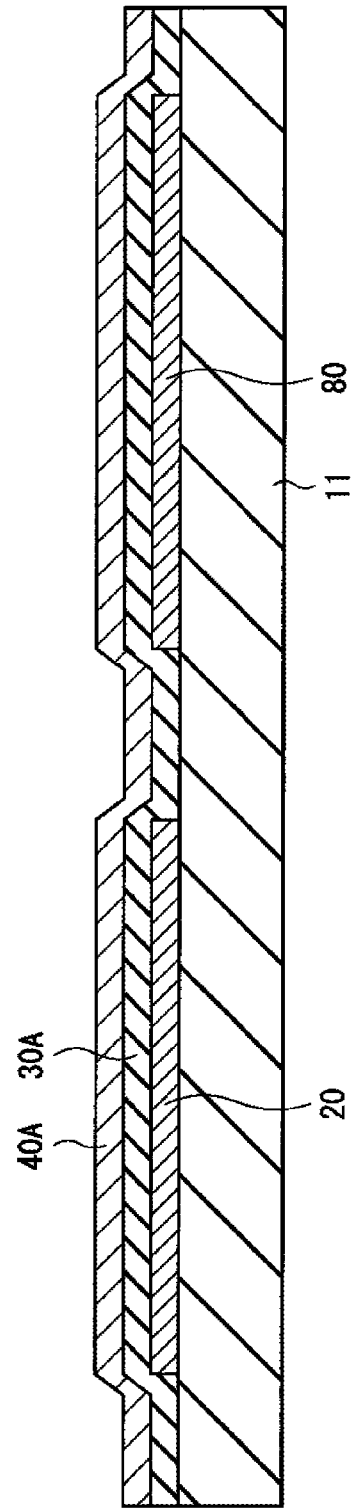
FIG.4A
FIG.4B

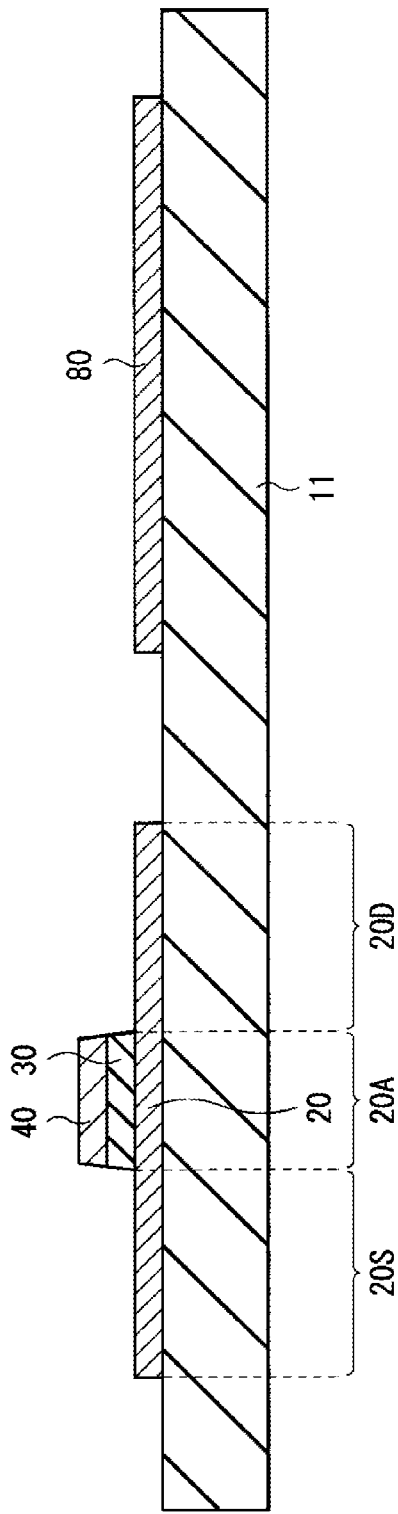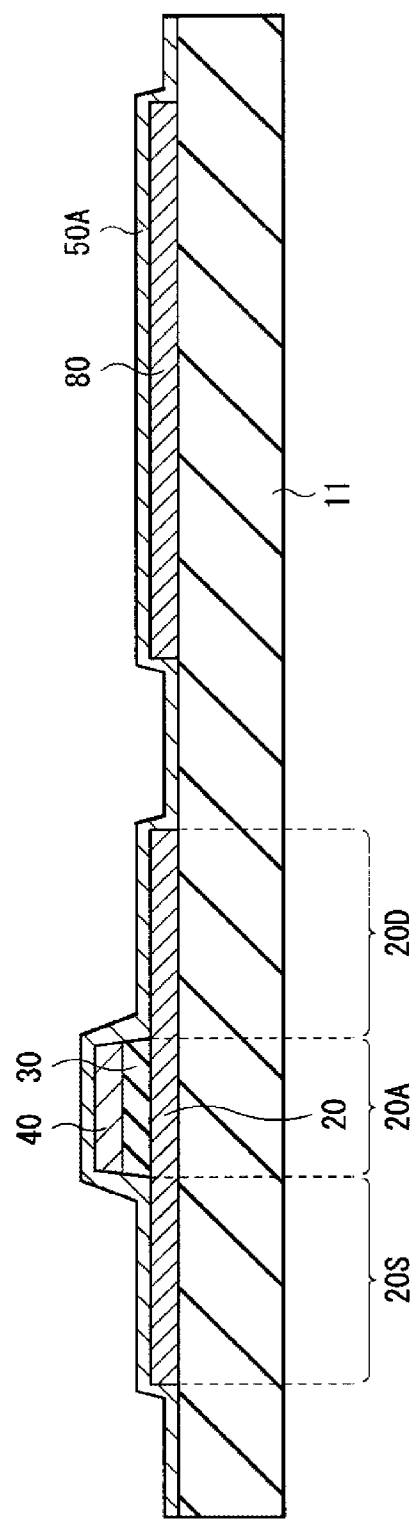

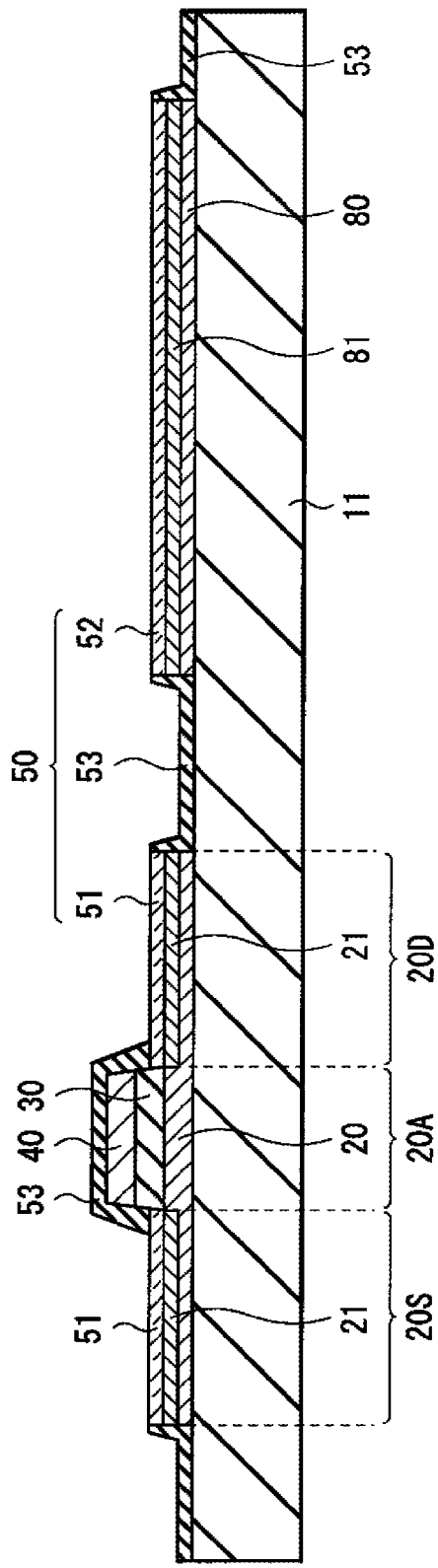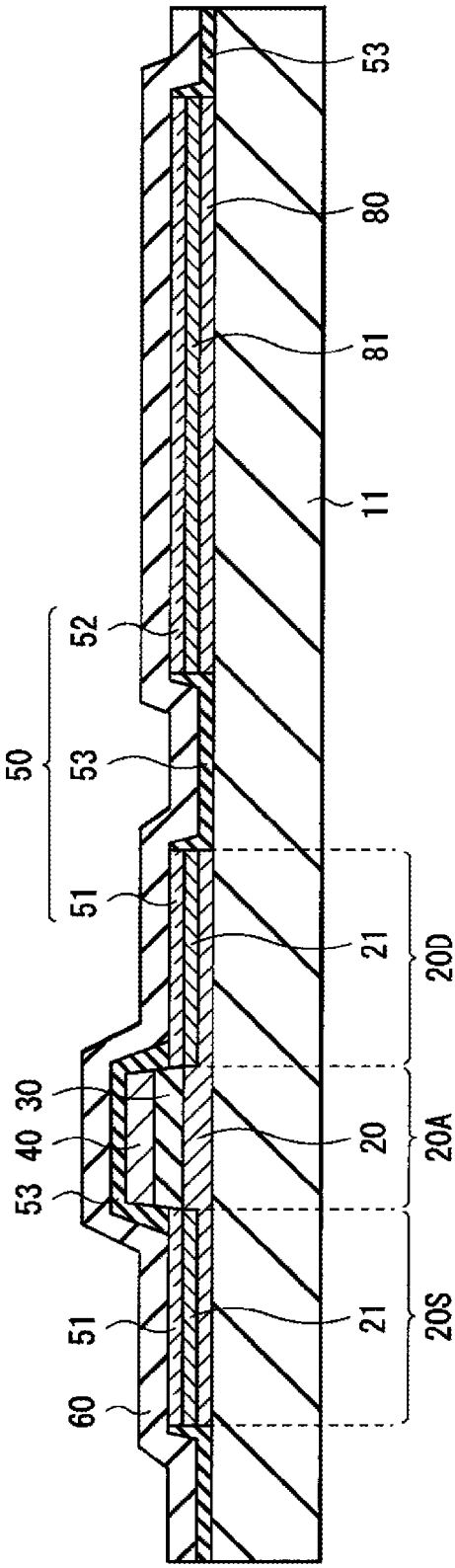

| STRUCTURE | ORGANIC LAYER | ITO | GLASS SUBSTRATE |
|---|---|---|---|
| · · | PRESENCE | PRESENCE | PRESENCE |
| · · | ABSENCE | PRESENCE | PRESENCE |

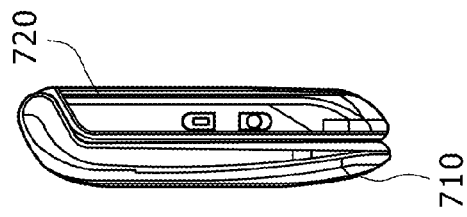
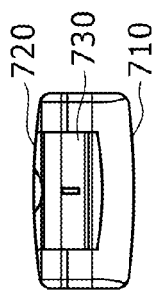
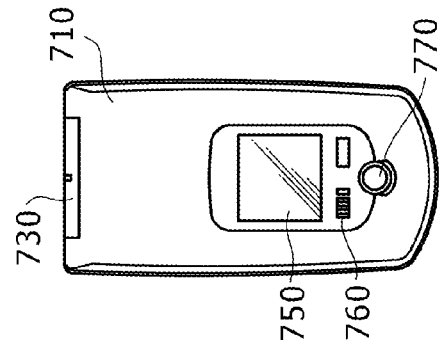
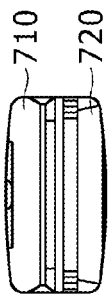
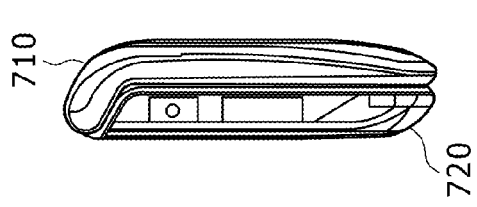
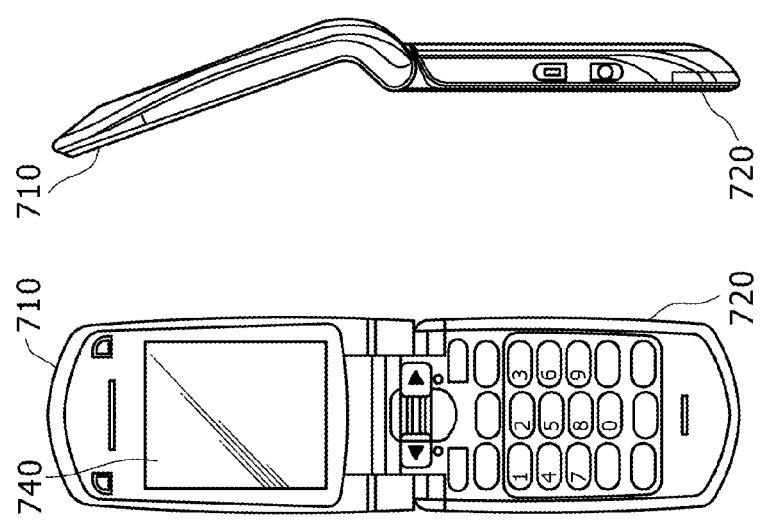
FIG.18A FIG.18B FIG.18C FIG.18D FIG.18E FIG.18F FIG.18G

DISPLAY DEVICE AND ELECTRONIC APPARATUS INCLUDING THE SAME

BACKGROUND

The present disclosure relates to a display device having a Thin Film Transistor (TFT), using an semiconductor oxide, as a drive element in a pixel, and an electronic apparatus including the display device.

In either a liquid crystal display device using an active drive system or an organic Electroluminescence (EL) display device, a thin film transistor is used as a drive element, and electric charges corresponding to a signal voltage for writing an image are held in a hold capacitor. However, when a parasitic capacitance generated in an area of intersection between a gate electrode and a source electrode or a drain electrode of the thin film transistor becomes large, there is the possibility that the signal voltage is changed and thus the image quality is caused to become worse.

In particular, in the organic EL display device, when the parasitic capacitance is large, it is also necessary to increase the capacitance value of the hold capacitor, which results in that a rate of occupation of wirings and the like in a layout of the pixels becomes large. As a result, there is caused a problem that a probability of generation of short-circuit or the like between the wirings is increased, thereby reducing the manufacturing yield.

Then, heretofore, with regard to the thin film transistor in which a semiconductor oxide such as a zinc oxide (ZnO) or an indium gallium zinc oxide (IGZO) is used in a channel, the parasitic capacitance formed in an area of intersection between a gate electrode and a source electrode or a drain electrode has been tried to be reduced.

For example, Japanese Patent Laid-Open No. 2007-220817 (referred to as Patent Document 1 hereinafter) and J. Park and 11 others: "Self-aligned top-gate amorphous gallium indium zinc oxide thin film transistors," Applied Physics Letters, American Institute of Physics, 2008, Vol. 93, 053501 (referred to as Non-patent Document 1 hereinafter) describe a self-aligned top-gate thin film transistor. In this case, in the self-aligned top-gate thin film transistor, after a gate electrode and a gate insulating film are formed on a channel region of a semiconductor oxide thin film layer so as to have the same shape, a resistance of an area which is not covered with the gate electrode made from the semiconductor oxide thin film layer and the gate insulating film is reduced, thereby forming a source/drain region. In addition, R. Hayashi, and six others: "Improved Amorphous In—Ga—Zn—O TFTs," SID 08 DIGEST, 2008, 42, 1, pp. 621 to 624 (referred to as Non-patent Document 2 hereinafter) describes a bottom-gate thin film transistor having a self-aligned structure. In this case, in the bottom-gate thin film transistor having the self-aligned structure, back surface exposure is carried out with a gate electrode as a mask, thereby forming both of a source region and a drain region in a semiconductor oxide film.

SUMMARY

However, in Patent Document 1 and Non-patent Document 2, for the purpose of forming the source/drain region having the low resistance in the self-aligned manner, a silicon nitride film is formed as an interlayer insulating film by utilizing a plasma CVD (Chemical Vapor Deposition) method, and hydrogen contained in the silicon nitride film is introduced into the semiconductor oxide thin film layer. In addition, in Non-patent Document 1, the introduction of hydrogen from a silicon nitride film and plasma processing for a hydrogen gas are carried out at the same time. In addition, in Non-patent Document 1, a semiconductor oxide film is exposed to the plasma ambient atmosphere of an argon gas, thereby forming a source/drain region having a low resistance. Those existing methods involve a problem that the element characteristics depend on the plasma process having many fluctuation elements, and thus it is difficult to stably apply any of those existing methods to the mass production.

The present disclosure has been made in order to solve the problems described above, and it is therefore desirable to provide a display device which includes a thin film transistor having a self-aligned structure and having stable characteristics, and which can carry out high quality display, and an electronic apparatus including the display device.

In order to attain the desire described above, according to an embodiment of the present disclosure, there is provided a display device, including:

a substrate;

a display element provided on the substrate;

a thin film transistor provided on the substrate, and having a first semiconductor oxide film including a source region and a drain region on both sides of a channel region, the first semiconductor oxide film having first low resistance areas each of whose oxygen concentration is lower than that of the channel region in at least parts of the source region and the drain region in a depth direction from upper surfaces of the source region and the drain region;

a second semiconductor oxide film provided in an area, of the substrate, other than the area in which the thin film transistor is provided, and having a second low resistance area whose oxygen concentration is lower than that of the channel region in at least a part in the depth direction from the upper surface; and a high resistance film covering the thin film transistor, the second semiconductor oxide film, and the substrate, made of a metallic oxide, having a first translucent area in an area contacting the first low resistance area, and having a second translucent area in an area contacting the second low resistance area.

In the display device according to the embodiment of the present disclosure, the display element is driven by the thin film transistor, thereby displaying an image. In this case, the low resistance areas each of whose oxygen concentration is lower than that of the channel region are provided in at least the parts of the source region and the drain region of the first semiconductor oxide film in the depth direction from the upper surfaces of the source region and the drain region. Therefore, the element characteristics become stable.

In addition, the second semiconductor oxide film is provided in the area, of the substrate, other than the area in which the thin film transistor is provided. The second semiconductor oxide film has the second low resistance area whose oxygen concentration is lower than the channel region in at least the part in the depth direction from the upper surface. The thin film transistor, the second semiconductor oxide film, and the substrate are all covered with the high resistance film made of the metallic oxide. The high resistance film has the first translucent area in the area contacting the first low resistance area, and has the second translucent area in the area contacting the second low resistance area. Therefore, the optical absorption in the second translucent area is suppressed. When the display element is composed of an organic electroluminescence element, the emitted light is transmitted through the second translucent area to be taken out from the substrate side. When the display element is composed of a liquid crystal display element, a light emitted from an illumination portion provided on the back surface side of the substrate is transmitted through the second translucent area to be made incident to the display element.

According to another embodiment of the present disclosure, there is provided an electronic apparatus, including a display device. The display device includes: a substrate; a display element provided on the substrate; a thin film transistor provided on the substrate, and having a first semiconductor oxide film including a source region and a drain region on both sides of a channel region, the first semiconductor oxide film having first low resistance areas each of whose oxygen concentration is lower than that of the channel region in at least parts of the source region and the drain region in a depth direction from upper surfaces of the source region and the drain region; a second semiconductor oxide film provided in an area, of the substrate, other than the area in which the thin film transistor is provided, and having a second low resistance area whose oxygen concentration is lower than that of the channel region in at least a part in the depth direction from the upper surface; and a high resistance film covering the thin film transistor, the second semiconductor oxide film, and the substrate, made of a metallic oxide, having a first translucent area in an area contacting the first low resistance area, and having a second translucent area in an area contacting the second low resistance area.

In the electronic apparatus according to another embodiment of the present disclosure, an image is displayed by the display device according to the embodiment of the present disclosure.

As set forth hereinabove, according to an embodiment of the present disclosure, the low resistance areas each of whose oxygen concentration is lower than that of the channel region is provided in at least the parts of the source region and the drain region of the first semiconductor oxide film of the thin film transistor in the depth direction from the upper surfaces of the source region and the drain region. Therefore, it becomes possible to stabilize the characteristics of the thin film transistor having the self-aligned structure. As a result, the high quality display can be carried out by using the thin film transistor having the stable characteristics together with the self-aligned structure having the small parasitic capacitance.

In addition, according to an embodiment of the present disclosure, the second semiconductor oxide film is provided in the area, of the substrate, other than the area in which the thin film transistor is provided. Also, the second low resistance area whose oxygen concentration is lower than that of the channel region is provided in at least the part of the second semiconductor oxide film in the depth direction from the upper surface of the second semiconductor oxide film. In addition, the thin film transistor, the second semiconductor oxide film, and the substrate are all covered with the high resistance film made of the metallic oxide. The first translucent area is provided in the area of the high resistance film contacting the first lower resistance area, and the second translucent area is provided in the area of the high resistance film contacting the second low resistance area. As a result, the optical absorption by the second translucent area is suppressed, thereby making it possible to carry out the high quality display.

BRIEF DESCRIPTION OF THE DRAWINGS

FIGS. 4A to 4F are respectively cross sectional views showing a method of manufacturing the display device shown in FIG. 1 in the order of processes;

FIGS. 18A to 18G are respectively a front view of a mobile phone as a fifth example of application, in an open state, to which the display device shown in FIG. 1 is applied, a side elevational view thereof in the open state, a front view thereof in a close state, a left side elevational view thereof in the close state, a right side elevational view thereof in the close state, a top plan view thereof in the close state, and a bottom view thereof in the close state.

DETAILED DESCRIPTION OF THE PREFERRED EMBODIMENTS

Embodiments of the present disclosure will be described in detail hereinafter with reference to the accompanying drawings. It is noted that the description will be given below in accordance with the following order:

1. Embodiment (a top-gate thin film transistor; the case of an organic EL element);
2. Modification 1 (a top-gate thin film transistor; the case where a first semiconductor oxide film and a second semiconductor oxide film are continuously provided);
3. Modification 2 (a top-gate thin film transistor; the case of a liquid crystal display element);
4. Modification 3 (a bottom-gate thin film transistor; the case of an organic EL element);
5. Examples of Application.

1. Embodiment

Figure 1:
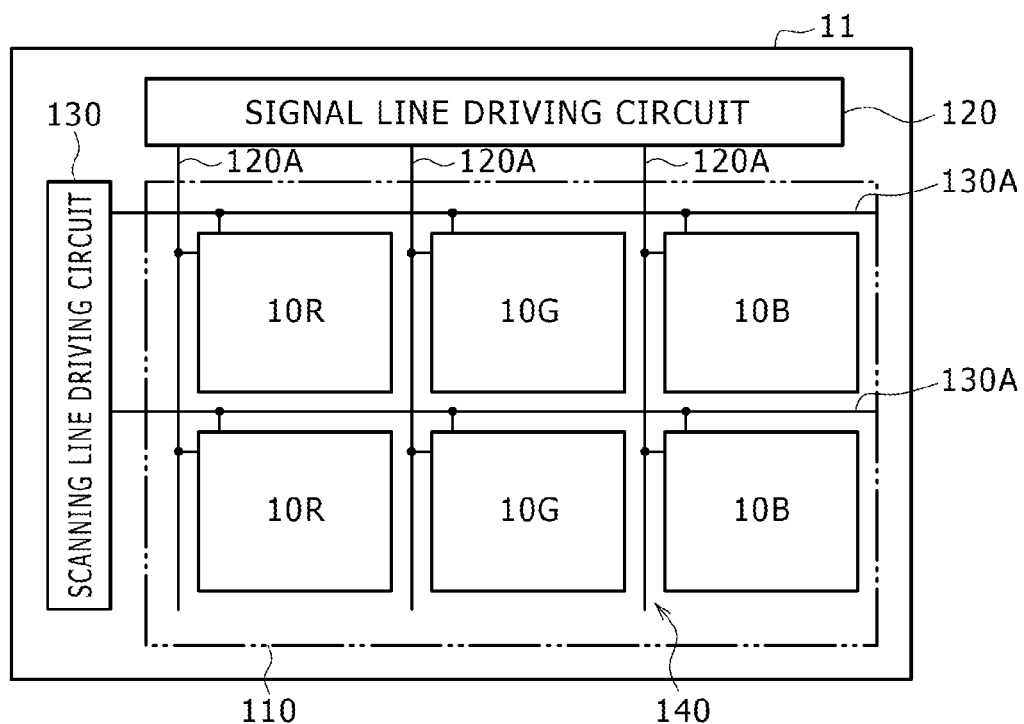
FIG. 1 is a block diagram showing a configuration of a display device according to an embodiment of the present disclosure.

FIG. 1 is a block diagram showing a configuration of a display device, using an organic electroluminescence element, according to an embodiment of the present disclosure. The display device of the embodiment is used as an ultrathin organic electroluminescence color display device or the like. For example, the display device of the embodiment is provided with a display area 110 in which plural organic electroluminescence elements 10R, 10G, and 10B which will be described later are disposed in a matrix on a substrate 11 such as a glass substrate. A signal line driving circuit 120 and a scanning line driving circuit 130 as drivers for image display are provided in the circumference of the display area 110.

Figure 2:
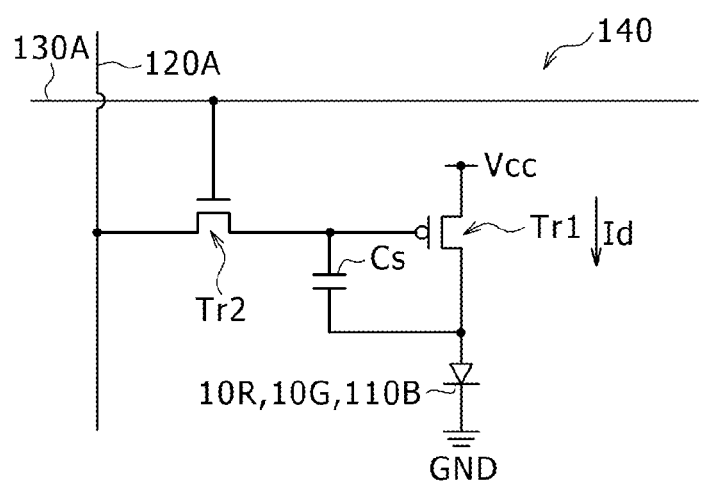
FIG. 2 is a circuit diagram showing a configuration of a part of a pixel driving circuit shown in FIG. 1.

A pixel driving circuit 140 is provided in the display area 110. FIG. 2 is a circuit diagram showing a configuration of a part of the pixel driving circuit 140. The pixel driving circuit 140 is an active type drive circuit formed in a lower layer of a first electrode 13 which will be described later. The pixel driving circuit 140, for example, includes a drive transistor Tr1 and a write transistor Tr2, a capacitor (hold capacitor) Cs, and an organic electroluminescence element 10R (or 10G, 10B). In this case, the organic electroluminescence element 10R (or 10G, 10B) is connected in series with the drive transistor Tr1 between a first power source line (Vcc) and a second power source line (GND). One electrode of the capacitor Cs is connected between the driver transistor Tr1 and the write transistor Tr2, and the other electrode thereof is connected between the drive transistor Tr1 and the organic electroluminescence element 10R (or 10G, 10B).

In the pixel drive circuit 140, plural signal lines 120A are disposed in a column direction, and plural scanning lines 130A are disposed in a row direction. An intersection point between each signal line 120A and each scanning line 130A corresponds to any one (sub-pixel) of the organic electroluminescence elements 10R, 10G, and 10B. The signal lines 120A are connected to the signal line driving circuit 120. Thus, image signals are supplied from the signal line driving circuit 120 to source electrodes of the write transistors Tr2 through the signal lines 120A, respectively. The scanning lines 130A are connected to the scanning line driving circuit 130. Thus, scanning signals are successively supplied from the scanning line driving circuit 130 to gate electrodes of the write transistors Tr2 through the scanning lines 130A, sequentially.

Figure 3:
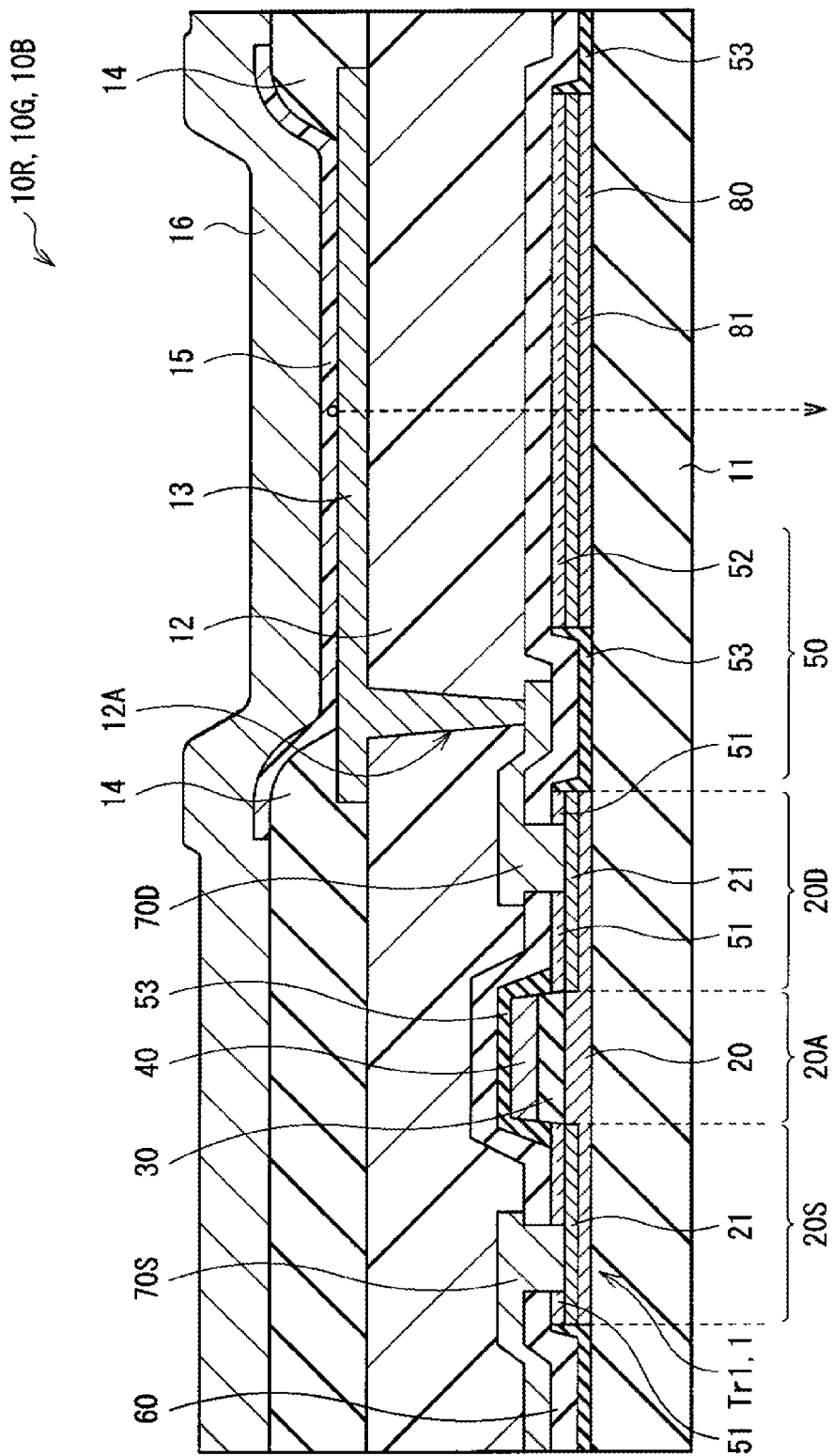
FIG. 3 is a cross sectional view showing a structure of a part of a drive transistor and a display element shown in FIG. 2.

FIG. 3 is a cross sectional view showing a structure of a part of the display area 110 shown in FIG. 1. The organic electroluminescence element 10R (or 10G, 10B) as the display element, and the drive transistor Tr1 are provided on the substrate 11. It is noted that the write transistor Tr2 also has the same structure as that of the drive transistor Tr1. In the following description, we shall collectively refer the drive transistor Tr1 and the write transistor Tr2 as a thin film transistor 1.

Each of the organic electroluminescence elements 10R, 10G, and 10B has a structure in which a first electrode 13, a pixel separation insulating film 14, an organic layer 15 including a light emitting layer, and a second electrode 16 are laminated in this order from the substrate 11 side through the drive transistor Tr1 and a planarizing film 12 of the pixel driving circuit 140 described above.

Such organic electroluminescence elements 10R, 10G, and 10B are all covered with a protective film (not shown) such as a silicon nitride film. Also, an encapsulating substrate (not shown) made of a glass or the like is stuck to the entire surface of the protective film through an adhesive layer (not shown) made of either a thermoplastic resin or an ultraviolet curable resin, thereby encapsulating the organic electroluminescence elements 10R, 10G, and 10B.

The planarizing film 12 is used to planarize the surface of the substrate 11 on which the pixel driving circuit 140 is formed. The planarizing film 12, for example, is made of either an organic material such as acrylic or polyimide, or an inorganic material such as a silicon oxide film or a silicon nitride film. A connection hole 12A through which electrical connection between the drive transistor Tr1 and a lower electrode 13 is obtained is provided in the planarizing film 12.

The first electrodes 13 are formed so as to correspond to the organic electroluminescence elements 10R, 10G, and 10B, respectively. The first electrode 13, for example, is composed of a transparent electrode made of an indium tin oxide (ITO), an indium zinc oxide (IZO (registered trademark)), $SnO_2$ or the like. Thus, a light emitted from a light emitting layer is taken out from the lower electrode 13 side (bottom-emission).

The pixel separation insulating film 14 is used to ensure the insulating property between the first electrode 13 and the second electrode 16 and to form a light emission area into a desired shape precisely. The pixel separation insulating film 14, for example, has a thickness of about 1 μm, and is made of a silicon oxide or a photosensitive resin such as polyimide. An opening portion is formed in the pixel separation insulating film 14 so as to correspond to the light emitting area. It is noted that although the organic layer 15 and the second electrode 16 are continuously formed on the pixel separation insulating film 14 as well, the light emission is generated only in the opening portion of the pixel separation insulating film 14.

Although the organic layer 15, for example, has a structure in which a hole injection layer, a hole transport layer, a light emitting layer, an electron transport layer, and an electron injection layer are laminated in the order from the first electrode 13 side, of these layers, it is only necessary to provide the layers other than the light emitting layer as may be necessary. In addition, the organic layers 15 may have different structures depending on light emission colors of the organic electroluminescence elements 10R, 10G, and 10B, respectively. The hole injection layer is a buffer layer for enhancing the hole injection efficiency, and preventing a leakage current. The hole transport layer is used to enhance the efficiency of transporting the holes to the light emitting layer. The light emitting layer emits a light through recombination between the electron and the hole generated by application of an electric field. The electron transport layer is used to enhance the efficiency of transporting the electrons to the light emitting layer. The electron injection layer, for example, has a thickness of about 0.3 nm, and is made of LiF, $Li_2O$ or the like.

The hole injection layer of the organic electroluminescence element 10R, for example, has a thickness of 5 to 300 nm, and is made of 4,4',4"-tris(3-methylphenylphenylamino) triphenylamine (m-MTDATA) or 4,4',4"-tris(2-naphthylphenylamino)triphenylamine (2-TNATA). The hole transport layer of the organic electroluminescence element 10R, for example, has a thickness of 5 to 300 nm, and is made of bis[(N-naphthyl)-N-phenyl]benzidine (α-NPD). A red light emitting layer 15CR of the organic electroluminescence element 10R, for example, has a thickness of 10 to 100 nm, and is made of an organic material obtained by mixing 9,10-di-(2-naphthyl)anthracene (ADN) with 30 wt % of 2,6=bis[4'=methoxydiphenylamino]styryl=1,5=dicyanonaphthalene (BSN). The electron transport layer of the organic electroluminescence element 10R, for example, has a thickness of 5 to 300 nm, and is made of 8=hydroxyquinoline aluminum ($Alq_3$).

The hole injection layer of the organic electroluminescence element 10G, for example, has a thickness of 5 to 300 nm, and is made of either m-MTDATA or 2-TNATA. The hole transport layer of the organic electroluminescence element 10G, for example, has a thickness of 5 to 300 nm, and is made of α-NPN. A green light emitting layer 15CG of the organic electroluminescence element 10G, for example, has a thickness of 10 to 100 nm, and is made of an organic material obtained by mixing ADN with 5 vol % of coumalin (Coumarin 6). The electron transport layer of the organic electroluminescence element 10G, for example, has a thickness of 5 to 300 nm, and is made of $Alq_3$.

The hole injection layer of the organic electroluminescence element 10B, for example, has a thickness of 5 to 300 nm, and is made of either m-MTDATA or 2-TNATA. The hole transport layer of the organic electroluminescence element 10B, for example, has a thickness of 5 to 300 nm, and is made of α-NPD. A blue light emitting layer 15CB of the organic electroluminescence element 10B, for example, has a thickness of 10 to 100 nm, and is made of an organic material obtained by mixing ADN with 2.5 wt % of 4,4'=bis[2={4=(N,N'=diphenyl amino)phenyl}vinyl]biphenyl(DPAVBi). The electron transport layer of the organic electroluminescence element 10B, for example, has a thickness of 5 to 300 nm, and is made of $Alq_3$.

The second electrode 16 is composed of a reflecting electrode made of a single substance of a metallic element such as gold (Au), platinum (Pt), nickel (Ni), chromium (Cr), copper (Cu), tungsten (W), aluminum (Al), molybdenum (Mo) or silver (Ag), or an alloy thereof. In addition, the upper electrode 16 is composed of a composite membrane including a layer made of the single substance of the metallic element described above, or the alloy thereof, and the transparent electrode identical to the first electrode 13.

The thin film transistor 1, for example, has a top-gate type (staggered type) structure in which the first semiconductor oxide film 20, the gate insulating film 30, and the gate electrode 40 are laminated in this order on the substrate 11.

The substrate 11, for example, is composed of a glass substrate, a plastic film or the like. The plastic material, for example, includes PET (polyethyleneterephthalate), and PEN (polyethylenenaphthalate). Since the first semiconductor oxide film 20 is deposited by utilizing a sputtering method which will be described later without heating the substrate 11, an inexpensive plastic film can be used. In addition, the substrate 11 may be a metallic substrate such as a stainless steel (SUS) in accordance with the intended use.

The first semiconductor oxide film 20 is provided in an island shape including the gate electrode 40 and the vicinity thereof on the substrate 11, and has a function as an active layer of the thin film transistor 1. The first semiconductor oxide film 20, for example, has a thickness of about 50 nm and has also a channel region 20A facing the gate electrode 40. The gate insulating film 30 and the gate electrode 40 are formed in this order on the channel region 20A so as to have the same shape. A source region 20S is provided on one side of the channel region 20A, and a drain region 20D is provided on the other side thereof, respectively.

The channel region 20A is made of a semiconductor oxide. Here, the semiconductor oxide is a compound containing therein an element such as indium, gallium, zinc or tin, and oxygen. Specifically, an amorphous semiconductor oxide includes an indium gallium zinc oxide (IGZO). Also, a crystalline semiconductor oxide includes a zinc oxide (ZnO), an indium zinc oxide (IZO (registered trademark)), an indium gallium oxide (IGO), an indium tin oxide (ITO), or an indium oxide (InO).

Each of the source region 20S and the drain region 20D has a first low resistance region 21 in a part in a depth direction from an upper surface of each of the source region 20S and the drain region 20D. The first low resistance region 21, for example, has a low resistance value by making an oxygen concentration thereof less than that of the channel region 20A. As a result, in the display device of the embodiment, it becomes possible to stabilize the characteristics of the thin film transistor 1 having a self-aligned structure.

A concentration of oxygen contained in the first low resistance region 21 is preferably equal to or smaller than 30%. The reason for this is because when the concentration of oxygen in the first low resistance region 21 exceeds 30%, the resistance value of the first low resistance region 21 is increased.

An area, of each of the source region 20S and the drain region 20D, other than the first low resistance area 21 is made of a semiconductor oxide similarly to the case of the channel region 20A. The depth of the first low resistance area 21 will be described later.

The gate insulating film 30, for example, has a thickness of about 300 nm, and is composed of a single layer film such as a silicon oxide film, a silicon nitride film, a silicon nitrided oxide film or an aluminum oxide film, or a lamination film thereof. In particular, either the silicon oxide film or the aluminum oxide film is preferable because the silicon oxide film or the aluminum oxide film is hard to reduce the semiconductor oxide film 20.

The gate electrode 40 has a part of applying a gate voltage to the thin film transistor 1, and controlling an electron density in the semiconductor oxide film 20 by the gate voltage. The gate electrode 40 is provided in a selective area above the substrate 11 and, for example, has a thickness of 10 to 500 nm, specifically, about 200 nm. Also, the gate electrode 40 is made of molybdenum (Mo). Since the gate electrode 40 preferably has a low resistance value, a low resistance metal such as aluminum (Al) or copper (Cu) is preferable as a constituent material of the gate electrode 40. In addition, a lamination film obtained by combining a low resistance layer made of aluminum (Al) or copper (Cu) and a barrier layer made of titanium (Ti) or molybdenum (Mo) with each other is also preferable as the constituent material of the gate electrode 40. The reason for this is because the resistance value of the gate electrode 40 can be reduced.

In addition, as shown in FIG. 3, a second semiconductor oxide film 80 is provided in an area, of the substrate 11, other than the area in which the thin film transistor 1 is provided. The surfaces of the thin film transistor 1, the second semiconductor oxide film 80, and the substrate 11 are all covered with a high resistance film 50 made of a metallic oxide. An interlayer insulating film 60 is provided on the high resistance film 50. The source electrode 70S and the drain electrode 70D are connected to the first low resistance areas 21 of the thin film transistor 1 through connection holes provided in the high resistance film 50 and the interlayer insulating film 60. It is noted that the first electrode 13 of the organic electroluminescence element 10R (or 10G, 10B), for example, is connected to the drain electrode 70D.

The second semiconductor oxide film 80 is provided in an island shape separated from the first semiconductor oxide film 20 in an area right below the organic electroluminescence element 10R (or 10G, 10B). The second semiconductor oxide film 80, for example, has a thickness of about 50 nm similarly to the case of the first semiconductor oxide film 20, and is made of the same semiconductor oxide as that of the first semiconductor oxide film 20.

The second semiconductor oxide film 80 has a second low resistance area 81 in a part thereof in the depth direction from the upper surface. A resistance value of the second low resistance area 81 is reduced by, for example, making the oxygen concentration thereof lower than that of the channel region 20A similarly to the case of the first low resistance area 21.

The concentration of oxygen contained in the second low resistance area 81 is preferably equal to or smaller than 30% similarly to the case of the first low resistance area 21.

An area, of the second semiconductor oxide film 80, other than the second low resistance area 81 is made of the same semiconductor oxide as that of the channel region 20A. A depth of the second low resistance area 81 will be described later.

The high resistance film 50 is obtained by oxidizing a metallic film of which each of the first low resistance area 21 and the second low resistance area 81 is to be made in manufacturing processes which will be described later and, for example, is formed from an aluminum oxide film. The high resistance film 50 formed from the aluminum oxide film has an excellent barrier property against the ambient air and thus can reduce an influence of oxygen and moisture which change the electrical characteristics of the first semiconductor oxide film 20. Therefore, the provision of the high resistance film 50 results in that it becomes possible to stabilize the electrical characteristics of the thin film transistor 1, and it becomes possible to further enhance the effect of the interlayer insulating film 60. A thickness of the high resistance film 50, for example, is equal to or smaller than 20 nm.

The high resistance film 50 has a first translucent area 51 in an area contacting the first low resistance area 21, and a second translucent area 52 in an area contacting the second low resistance area 81. Each of the first translucent area 51 and the second translucent area 52 is made of a metallic oxide containing therein oxygen at a stoichiometric proportion or at a rate close thereto, specifically, an aluminum oxide film. As a result, in the display device of the embodiment, the optical absorption in the second translucent area 52 is suppressed. Thus, the light emitted from the organic electroluminescence element 10R (or 10G, 10B) can be transmitted through the second translucent area 52 to be taken out from the substrate 11 side.

An area, of the high resistance film 50, other than the first translucent area 51 and the second translucent area 52 becomes a non-translucent area 53. The non-translucent area 53 is made of a lower oxide in which a rate of oxygen is lower than the stoichiometric proportion, specifically, a lower aluminum oxide or the like, and thus a transmittance of the non-translucent area 53 is lower than that of each of the first translucent area 51 and the second translucent area 52. Note that, it is not like that each of the first translucent area 51, the second translucent area 52, and the non-translucent area 53 does not contain therein the aluminum oxide having the composition other than the composition exemplified above at all. For example, a metallic oxide having the stoichiometric proportion, specifically, an aluminum oxide film may be contained in the non-translucent area 53. On the other hand, a lower oxide in which a rate of oxygen is lower than the stoichiometric proportion, specifically, a lower aluminum oxide or the like may be contained in each of the first translucent area 51 and the second translucent area 52.

The interlayer insulating film 60, for example, has a thickness of about 300 nm, and is formed from a single layer film such as a silicon oxide film or an aluminum oxide film, or a lamination film thereof. In particular, when the interlayer insulating film 60 is formed from the lamination film of the silicon oxide film and the aluminum oxide film, it is possible to suppress the mixing and diffusion of the moisture into the first semiconductor oxide film 20, and thus it is possible to further enhance the electrical stability and reliability of the thin film transistor 1.

The source electrode 70S and the drain electrode 70D are connected to the low resistance areas 21 through the connection holes provided in the interlayer insulating film 60 and the high resistance film 50, respectively. Each of the source electrode 70S and the drain electrode 70D, for example, has a thickness of about 200 nm, and is made of molybdenum (Mo). In addition, each of the source electrode 70S and the drain electrode 70D is preferably composed of a low resistance metallic wiring made of aluminum (Al), copper (Cu) or the like similarly to the case of the gate electrode 40. Moreover, each of the source electrode 70S and the drain electrode 70D is also preferably formed from a lamination film obtained by combining a low resistance layer made of aluminum (Al) or copper (Cu), and a barrier layer made of titanium (Ti) or molybdenum (Mo) with each other. Use of such a lamination film results in that the drive providing less wiring delay becomes possible.

In addition, each of the source electrode 70S and the drain electrode 70D is preferably provided so as to avoid an area right above the gate electrode 40. The reason for this is because it becomes possible to reduce the parasitic capacitance formed in an intersection area among the gate electrode 40, and the source electrode 70S and the drain electrode 70D.

The display device of the embodiment, for example, can be manufactured in the manner as will be described above.

FIGS. 4A to 4F are respectively cross sectional views showing a method of manufacturing the display device of the embodiment in the order of processes. Firstly, the semiconductor oxide film (not shown) made of the material described above is formed on the entire surface of the substrate 11 by, for example, utilizing a sputtering method so as to have the thickness of about 50 nm. In this case, a ceramic target having the same composition as that of each of the first semiconductor oxide film 20 and the second semiconductor oxide film 80 which are desired to be formed is used as a target. In addition, since a carrier concentration in the semiconductor oxide film largely depends on a partial pressure of oxygen during the sputtering, the partial pressure of oxygen is controlled so as to obtain the desired transistor characteristics.

Next, as shown in FIG. 4A, the first semiconductor oxide film 20 is formed in an island shape which includes the channel region 20A, the source region 20S on one side of the channel region 20A, and the drain region 20D on the other side thereof by, for example, utilizing a photolithography method and an etching method. At the same time, the second semiconductor oxide film 80 is formed in an island shape which includes an area, of the substrate 11, other than the area in which the thin film transistor 1 is intended to be formed (specifically, an area in which the organic electroluminescence elements 10R, 10G, and 10B are intended to be formed). In this case, the second semiconductor oxide film 80 is preferably processed by utilizing a wet etching method using a mixed liquid of a phosphoric acid, a nitric acid, and an acetic acid. The mixed liquid of a phosphoric acid, a nitric acid, and an acetic acid can largely increase an etching selectivity with the base, and thus the processing becomes relatively, readily possible.

Subsequently, as shown in FIG. 4B, a gate insulating material film 30A formed from a silicon oxide film, an aluminum oxide film or the like is formed over the entire surfaces of, the substrate 11, the first semiconductor oxide film 20, and the second semiconductor oxide film 80 by, for example, utilizing a plasma Chemical Vapor Deposition (CVD) method and the like so as to have a thickness of about 300 nm. The silicon oxide film can be formed by utilizing a reactive sputtering method in addition to the plasma CVD method. In addition, the aluminum oxide film can be formed by utilizing a reactive sputtering method, a CVD method or an atomic layer deposition method.

After that, as similarly shown in FIG. 4B, a gate electrode material film 40A formed from a single layer film made of molybdenum (Mo), titanium (Ti), aluminum (Al) or the like, or a lamination film thereof is formed over the entire surface of the gate insulating material film 30A by, for example, utilizing the sputtering method so as to have a thickness of about 200 nm.

After completion of the formation of the gate electrode material film 40A, as shown in FIG. 4C, the gate electrode material film 40A is formed into a desired shape by, for example, utilizing the photolithography method and the etching method, thereby forming the gate electrode 40 above the channel region 20A of the semiconductor oxide film 20.

Subsequently, as similarly shown in FIG. 4C, the gate insulating material film 30A is selectively etched away with the gate electrode 20 as a mask, thereby forming the gate insulating film 30. At this time, in the case where each of the first semiconductor oxide film 20 and the second semiconductor oxide film 80 is made of a crystallized material such as ZnO, IZO, or IGO, when the gate insulating material film 30A is selectively etched away, the gate insulating material film 30A can be readily processed while a very large etching selectivity is maintained by using a chemical such as a hydrofluoric acid. As a result, the gate insulating film 30 and the gate electrode 40 are formed in this order on the channel region 20A of the first semiconductor oxide film 20 so as to have the same shape.

After completion of the formation of the gate insulating film 30 and the gate electrode 40, as shown in FIG. 4D, a metallic film 50A made of a metal, such as aluminum (Al), which reacts with oxygen at a relatively low temperature is formed over the surfaces of the first semiconductor oxide film 20, the gate insulating film 30, the gate electrode 40, and the second semiconductor oxide film 80 by, for example, utilizing the sputtering method so as to have a thickness of, for example, 5 to 10 nm.

After completion of the formation of the metallic film 50A, as shown in FIG. 4E, the metallic film 50A is oxidized by carrying out a heat treatment, thereby forming the high resistance film 50. A part of oxygen contained in the source region 20S and the drain region 20D, and the second semiconductor oxide film 80 is utilized in the oxidation reaction of the metallic film 50A. For this reason, along with the proceeding of the oxidation of the metallic film 50A, the oxygen concentrations in the source region 20S and the drain region 20D, and the second semiconductor oxide film 80 are reduced from the upper surface sides of the source region 20S and the drain region 20D, and the second semiconductor oxide film 80 each contacting the metallic film 50A. As a result, the first low resistance areas 21 each of whose oxygen concentration is lower than that of the channel region 20A are formed in parts of the source region 20S and the drain region 20D in the depth direction from the upper surfaces of the source region 20S and the drain region 20D, respectively. At the same time, the second low resistance area 81 whose oxygen concentration is lower than that of the channel region 20A is formed in a part of the second semiconductor oxide film 80 in the depth direction from the upper surface of the second semiconductor oxide film 80.

The high resistance film 50 formed by oxidizing the metallic film 50A, as described above, has the first translucent area 51 and the second translucent area 52 each formed from the aluminum oxide film in the areas contacting the first low resistance area 21 and the second low resistance area 81, respectively. However, the area other than that area becomes the non-translucent area 53 made of the lower aluminum oxide. The reason for this is because oxygen is abundantly supplied in the areas, of the metallic film 50A, contacting the first semiconductor oxide film 20 and the second semiconductor oxide film 80, respectively, and thus the metallic oxide containing therein oxygen at the stoichiometric proportion or at the rate close thereto is formed. On the other hand, oxygen is insufficient in the area, of the metallic film 50A, containing neither the first semiconductor oxide film 20 nor the second semiconductor oxide film 80, and thus the lower oxide in which the rate of oxygen is lower than the stoichiometric proportion is formed.

Figure 5:
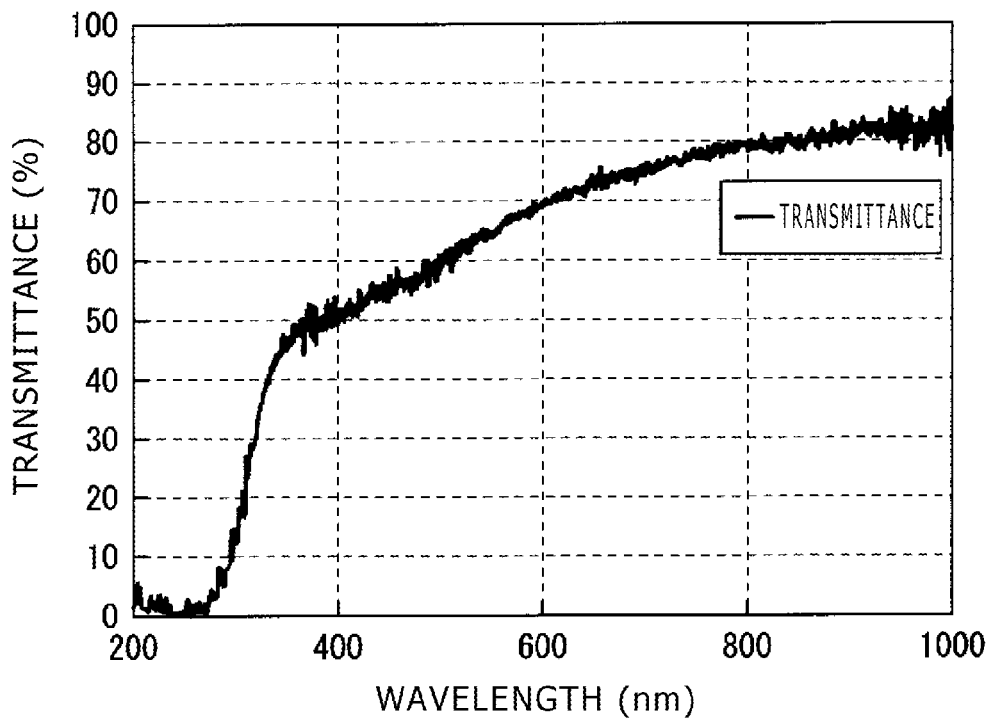
FIG. 5 is a graph showing characteristics of a thin film transistor shown in FIG. 3 in contrast with characteristics of an existing thin film transistor.

FIG. 5 shows results of checking up a transmittance after a metallic film (aluminum film) is formed on a glass substrate and is then heated. Although the aluminum oxide having the stoichiometric proportion ought to be transparent, as can be seen from FIG. 5, the transmittance in a visible light region (a wavelength region of about 400 to about 700 nm) is as low as about 50 to about 80%. That is to say, it is understood that even when the metallic film on the glass substrate is oxidized, the metallic film does not become perfectly transparent and remains as the low oxide showing the optical absorption. Therefore, in the display device using the bottom emission type organic electroluminescence element, when the metallic film is directly formed on the substrate and is then oxidized, the high resistance film made of the lower oxide remains in the lower layer of the organic electroluminescence element, which causes reduction of the light taking-out efficiency and reduction of the luminance. For this reason, a process for removing the high resistance film made of the lower oxide may be required to cause an increase in cost.

Figure 6:
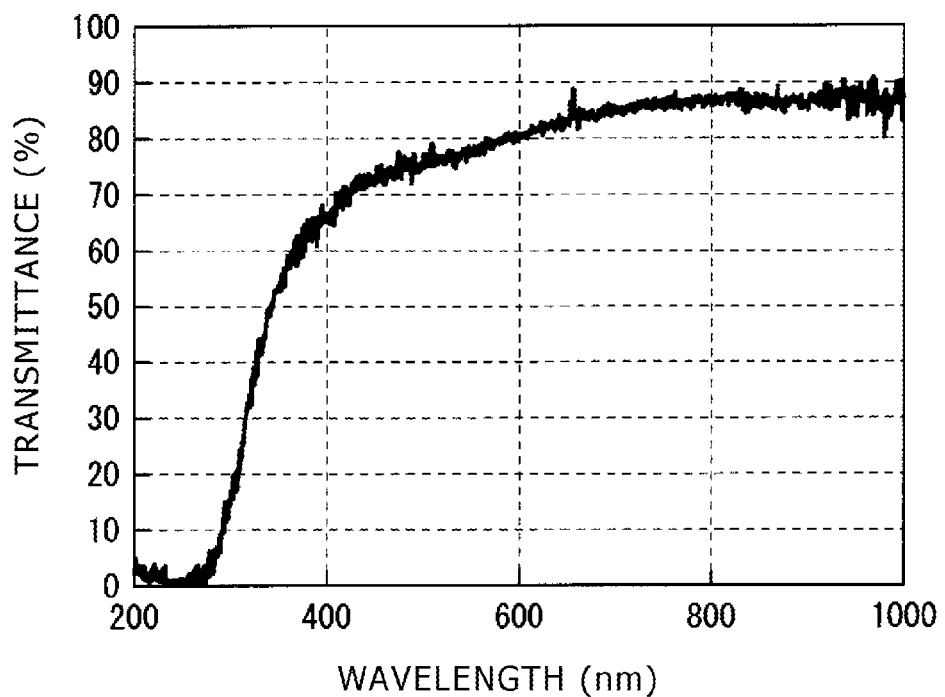
FIG. 6 is a graph showing results of measurements of a transmittance after heating of a metallic film on a glass substrate.

FIG. 6 shows results of checking up a transmittance after a semiconductor oxide film made of an IGZO and a metallic film (aluminum film) are formed in this order on a glass substrate and are then heated. It is understood from FIG. 6 that the transmittance in the visible light region (the wavelength region of about 400 to about 700 nm) is in the range of about 70 to about 90% which is largely higher than that shown in FIG. 5.

Figure 7:
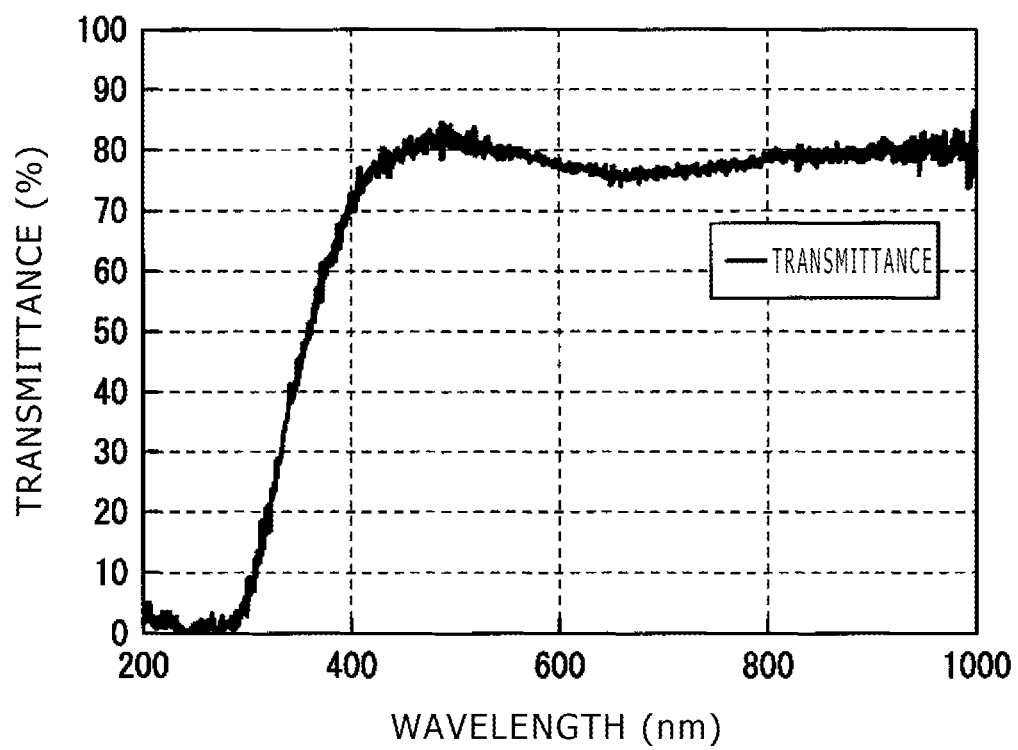
FIG. 7 is a graph showing results of measurements of a transmittance after heating of an IGZO film on a semiconductor oxide film.

FIG. 7 shows results of checking up a transmittance after a semiconductor oxide film made of an ITO and a metallic film (aluminum film) are formed in this order on a glass substrate and are then heated. It is understood from FIG. 7 that the transmittance in the visible light region (the wavelength region of about 400 to about 700 nm) is about 80% which is largely higher than that shown in FIG. 5.

It is understood from the results described above that while the metallic film 50A is heated, the metallic film 50A absorbs oxygen contained in the first semiconductor oxide film 20 and the second semiconductor oxide film 80, whereby the oxidation of the metallic film 50A is promoted, the metallic oxide containing therein oxygen at the stoichiometric proportion or at the rate close thereto is formed, and the transmittances of the first translucent area 51 and the second translucent area 52 becomes high. In addition, it is thought that this fact becomes a contributory factor for reducing the oxygen concentration of the first low resistance area 21 and the second low resistance area 81.

Figures 8A, 8B:
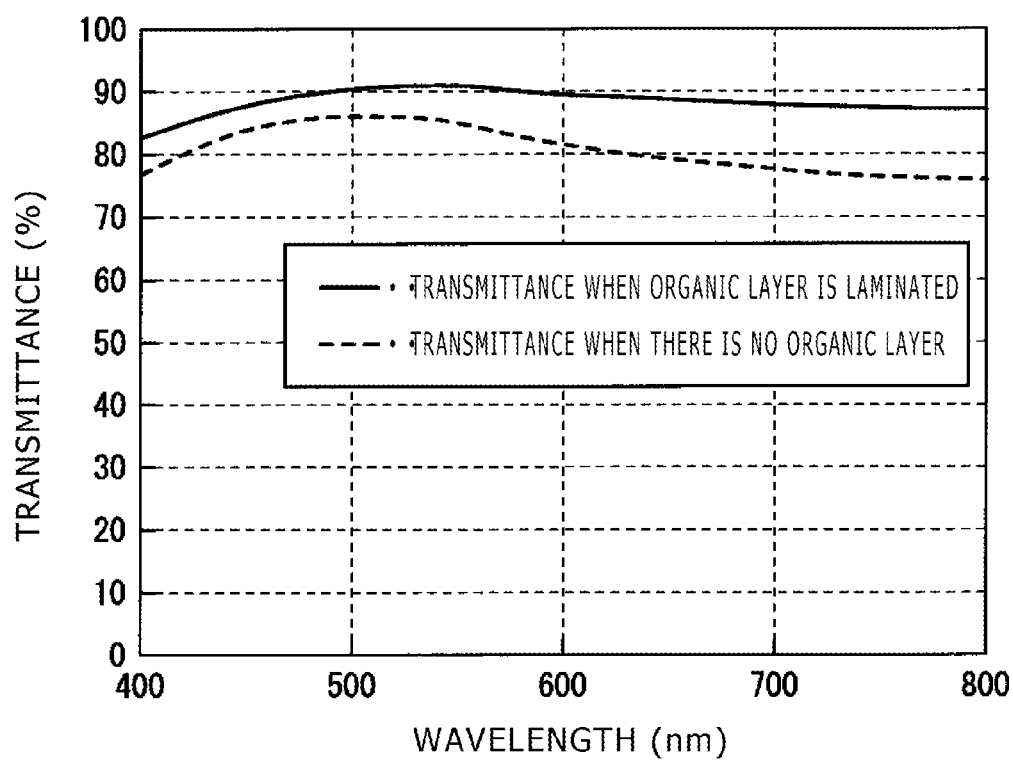
FIGS. 8A and 8B are respectively a diagram and a graph showing results of measurements of a transmittance after heating of an ITO film on a semiconductor oxide film.

It is noted that each of the cases shown in FIGS. 6 and 7 contains reflection from the glass surface, and reflection from an interface between the semiconductor oxide film and the air. Since in the actual display device, the lamination structure of the organic layers contacts the semiconductor oxide film, the reflection from the interface between the semiconductor oxide film and the air is relaxed. FIGS. 8A and 8B are respectively a diagram and a graph showing results of confirming this phenomenon by carrying out simulations. It is noted that TF-Calc (manufactured by Software Spectra Inc.) was used in the simulations.

As can be seen from FIGS. 8A and 8B, it is confirmed that the transmittance is more increased in the case where the organic layer is laminated on the semiconductor oxide film than in the case where no organic layer is laminated on the semiconductor oxide film, and becomes about 90% in the light emission wavelength region. The reason for this is because the reflection from the interface between the semiconductor oxide film having a large refractive index and the air is relaxed.

Referring back to FIG. 4E, a description is continuously given. With regard to the heat treatment for the metallic film 50A shown in FIG. 4E, for example, as described above, it is preferable to carry out the annealing at a temperature of about 300° C. In this case, the annealing is carried out in an oxidizing gas ambient atmosphere containing therein oxygen or the like, whereby it is suppressed that the oxygen concentrations of the first low resistance area 21 and the second low resistance area 81 become too low, and thus it becomes possible to supply the sufficient oxygen to each of the first semiconductor oxide film 20 and the second semiconductor oxide film 80. Therefore, an annealing process which ought to be carried out in a later process can be omitted, and thus the process can be simplified.

In addition, for example, in the process for forming the metallic film 50A shown in FIG. 4D, the temperature of the substrate 11 is made relatively as high as about 200° C., whereby both of the first low resistance area 21 and the second low resistance area 81 can also be formed without carrying out the heat treatment shown in FIG. 4E. In this case, it is possible to reduce a carrier concentration of the first semiconductor oxide film 20 to a level required in terms of the transistor.

As described above, the metallic film 50A is preferably formed so as to have the thickness of 10 nm or less. The reason for this is because if the thickness of the metallic film 50A is set equal to or smaller than 10 nm, the metallic film 50A can be completely oxidized by carrying out the heat treatment. When the metallic film 50A is not completely oxidized, a process for removing away the metallic film 50A by utilizing the suitable etching method may be required. On the other hand, when the metallic film 50A is completely oxidized to turn into the high resistance film 50, the process for removing away the metallic film 50A by utilizing the suitable etching method becomes unnecessary, and thus the manufacturing processes can be simplified. The metallic film 50A is formed so as to have the thickness of 10 nm or less, which results in that the thickness of the high resistance film 50 becomes equal to or smaller than 20 nm.

In this case, with regard to a method of oxidizing the metallic film 50A, the oxidation can also be promoted by utilizing a method such as oxidation in a steam ambient atmosphere or plasma oxidation in addition to the heat treatment. In particular, the plasma oxidation has an advantage that the plasma oxidation can be carried out right before the interlayer insulating film 60 is formed in a later process by utilizing the plasma CVD method, and thus it is unnecessary to especially increase the number of processes. In the plasma oxidation, for example, it is preferable that the temperature of the substrate 11 is set in the range of about 200 to about 400° C., and the plasma is generated in a gas ambient atmosphere of oxygen or in a gas ambient atmosphere containing therein oxygen in oxygen dinitride, thereby processing the metallic film 50A. As a result, it becomes possible to form the high resistance film 50 having the excellent barrier property against the ambient air as described above.

It is noted that the high resistance film 50, for example, is formed either on the gate insulating film 30 or on the gate electrode 40 in addition to the source region 20S and the drain region 20D of the semiconductor oxide film 20. However, even when the high resistance film 50 is left without being removed by carrying out the etching, this does not cause a leakage current.

After completion of the formation of the first low resistance area 21 and the second low resistance area 81, as shown in FIG. 4F, the interlayer insulating film 60, for example, formed from either a silicon oxide film or an aluminum oxide film, or a lamination film thereof is formed on the high resistance film 50 so as to have the thickness described above. In this case, the silicon oxide film can be formed by utilizing the plasma CVD method. The aluminum oxide film is preferably formed by utilizing the reactive sputtering method using a DC (direct current) or AC (alternating current) power source with aluminum as a target. The reason for this is because the aluminum oxide film can be deposited at a high deposition rate.

Subsequently, as shown in FIG. 3, the connection holes are formed in the interlayer insulating film 60 and the high resistance film 50, respectively, by, for example, utilizing the photolithography method and the etching method. After that, a molybdenum (Mo) film, for example, is formed on the interlayer insulating film 60 by, for example, utilizing the photolithography method and the etching method so as to have a thickness of 200 nm, and is then formed into a predetermined shape by utilizing the photolithography method and the etching method. As a result, as shown in FIG. 3, the source electrode 70S and the drain electrode 70D are connected to the respective first low resistance areas 21. With that, the thin film transistor 1 shown in FIG. 3 is formed.

After the pixel driving circuit 140 including the thin film transistor 1 has been formed on the substrate 11 in such a way, a photosensitive resin is applied over the entire surface of the substrate 11, and is then exposed and developed, whereby the planarizing film 12 having the connection hole 12A formed therein is formed, and is then burnt. Subsequently, the first electrode 13 is formed on the planarizing film 12, and the pixel separation insulating film 14 is formed in the area between each adjacent two first electrodes 13. After that, the organic layer 15 and the upper electrode 16 made of the respective materials described above are formed by, for example, utilizing an evaporation coating method. As a result, the organic electroluminescence elements 10R, 10G, and 10B are formed.

After completion of the formation of the organic electroluminescence elements 10R, 10G, and 10B, the protective film (not shown) is formed over the organic electroluminescence elements 10R, 10G, and 10B, and the encapsulating substrate (not shown) is stuck to the entire surface of the protective film through the adhesive layer (not shown). With that, the display device of the embodiment shown in FIGS. 1 to 3 is completed.

In the display device of the embodiment, the scanning signals are supplied from the scanning line driving circuit 130 to the pixels through the gate electrodes of the write transistors Tr2, respectively. Also, the image signals are supplied from the signal line driving circuit 120 to be held in the hold capacitor Cs through the write transistors Tr2, respectively. That is to say, the drive transistor Tr1 is controlled so as to be turned ON or OFF in accordance with the image signal held in the hold capacitor Cs. As a result, the drive currents Id are injected to the organic electroluminescence elements 10R, 10G, and 10B, respectively, whereby the hole and the electron are recombined with each other to emit a light. The light thus emitted is transmitted through the first electrode 13, the second translucent area 52 of the high resistance film 50, the second semiconductor oxide film 80, and the substrate 11 to be taken out (bottom emission).

In this case, the second semiconductor oxide film 80 is provided in the area, of the substrate 11, other than the area in which the thin film transistor 1 is provided, and the second translucent area 52 of the high resistance film 50 is provided so as to contact the second semiconductor oxide film 80. Therefore, the transmittance of the second translucent area 52 is enhanced, and thus the optical absorption in the second translucent area 52 becomes small. As a result, the efficiencies of taking out the lights emitted from the organic electroluminescence elements 10R, 10G, and 10B, respectively, are enhanced, and thus the luminances are enhanced.

In addition, in the thin film transistor 1, when a voltage (gate voltage) equal to or larger than a predetermined threshold voltage is applied to the gate electrode 40 through the wiring layer (not shown), a current (drain current) is generated in the channel region 20A of the first semiconductor oxide film 20. In this case, the first low resistance areas 21 each of whose oxygen concentration is lower than that of the channel region 20A are provided in at least the parts of the source region 20S and the drain region 20D of the first semiconductor oxide film 20 in the depth direction from the upper surfaces of the source region 20S and the drain region 20D of the first semiconductor oxide film 20, respectively. Therefore, the element characteristics become stable.

Figure 9A:
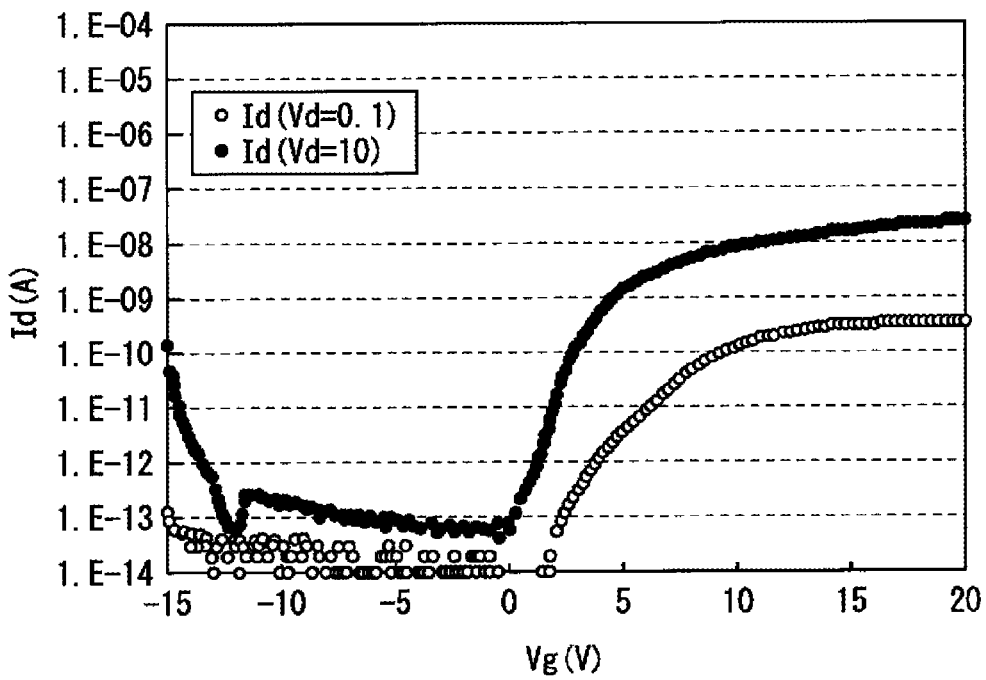
FIGS. 9A and 9B are respectively graphs showing results of simulations of a transmittance when an organic layer is laminated on a semiconductor oxide film.
Figure 9B:
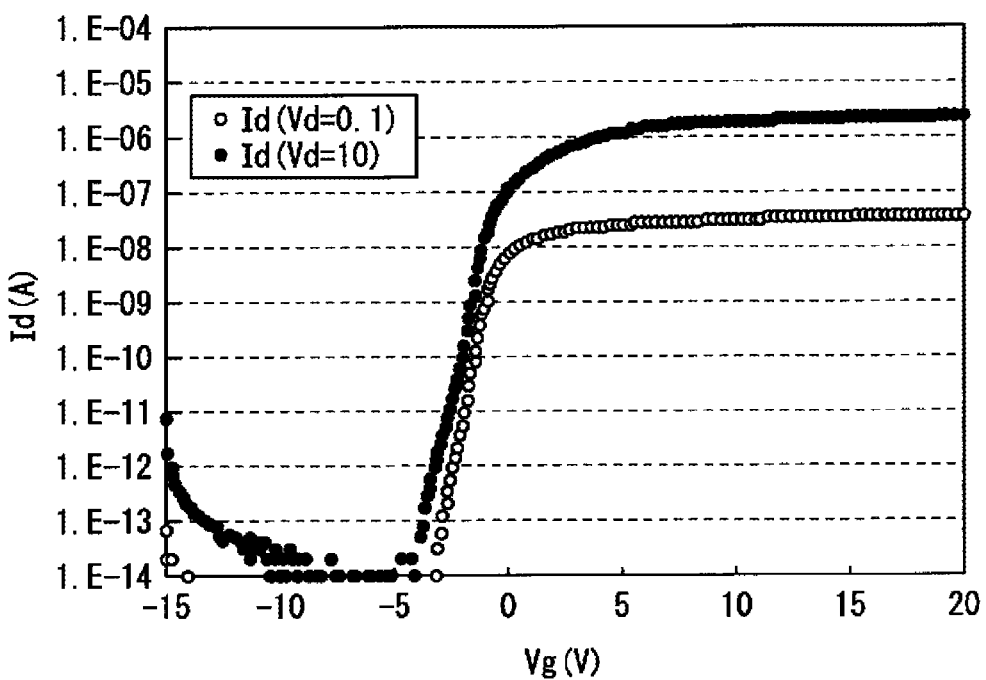

FIG. 9B is a graph showing results of checking up the transistor characteristics of the thin film transistor 1, having the first low resistance area 21, which was actually manufactured by utilizing the manufacturing method described above. In this case, an aluminum film having a thickness of 5 nm was used as the metallic film 50A, and the annealing was carried out as the heat treatment at 300° C. for an hour in an oxygen ambient atmosphere, thereby forming the low resistance area 21.

On the other hand, a thin film transistor was manufactured without carrying out the formation of the metallic film and the heat treatment therefor, and the transistor characteristics were checked up. FIG. 9A shows results of checking up the transistor characteristics. It is noted that in this case, no plasma treatment was carried out.

As can be seen from FIGS. 9A and 9B, enhancement of two or more orders of magnitude was obtained in the thin film transistor 1 in which the first low resistance area 21 was formed by carrying out the heat treatment for the metallic film 50A as compared with the case of the thin film transistor in which none of the formation and heat treatment for the metallic film was carried out. That is to say, it was found out that the first low resistance areas 21 each of whose oxygen concentration is lower than that of the channel region 20A are provided in at least the parts of the source region 20S and the drain region 20D of the first semiconductor oxide film 20 in the depth direction from the upper surfaces of the source region 20S and the drain region 20D of the first semiconductor oxide film 20, respectively, whereby it is possible to realize the thin film transistor 1 in which the parasitic capacitance is reduced due to the self-aligned structure, and the element characteristics are stabilized.

As described above, in the display device of the embodiment, since the first low resistance areas 21 each of whose oxygen concentration is lower than that of the channel region 20A are provided in at least the parts of the source region 20S and the drain region 20D of the first semiconductor oxide film 20 of the thin film transistor 1 in the depth direction from the upper surfaces of the source region 20S and the drain region 20D of the thin film transistor 1, respectively, it becomes possible to stabilize the characteristics of the top-gate thin film transistor having the self-aligned structure. Therefore, when the display device utilizing the active drive system is configured by using the thin film transistor 1, the high quality display becomes possible due to the thin film transistor 1 having the stable characteristics as well as the self-aligned structure having the small parasitic capacitance, which can respond to increased image screen, high definition, and high frame rate promotion. In addition, it becomes possible to apply a layout having a small hold capacitor and thus it becomes possible to reduce an occupation rate of the wirings in the pixel layout. Therefore, a probability of generation of defects due to inter-wiring short-circuit is reduced, thereby making it possible to increase the manufacturing yield.

In addition, after the gate insulating film 30 and the gate electrode 40 have been formed in this order on the channel region 20A of the first semiconductor oxide film 20 so as to have the same shape, the metallic film 50A is formed on the first semiconductor oxide film 20, the gate insulating film 30, and the gate electrode 40. Also, the heat treatment is carried out for the metallic film 50A, thereby causing the metallic film 50A to turn into the high resistance film 50 through the oxidation, and the first low resistance areas 21 each of whose oxygen concentration is lower than that of the channel region 20A are provided in at least the parts of the source region 20S and the drain region 20D of the first semiconductor oxide film 20 in the depth direction from the upper surfaces of the source region 20S and the drain region 20D of the first semiconductor oxide film 20, respectively. Therefore, the first low resistance area 21 can be formed without using the process having many fluctuation elements such as the plasma. Therefore, it is possible to dissolve the dependency of the element characteristics on the plasma process like the related art, and thus it becomes possible to obtain the stable element characteristics.

In addition, the second semiconductor oxide film 80 is provided in the area, of the substrate 11, other than the area in which the thin film transistor 1 is provided, and the second low resistance area 81 whose oxygen concentration is lower than that of the channel region 20A is provided in at least the part of the second semiconductor oxide film 80 in the depth direction from the upper surface of the second semiconductor oxide film 80. The thin film transistor 1, the second semiconductor oxide film 80, and the substrate 11 are all covered with the high resistance film 50. Also, the first translucent area 51 made of the metallic oxide having the stoichiometric proportion is provided in the area of the high resistance film 50 contacting the first low resistance area 21, and the second translucent area 52 made of the same metallic oxide as that of the first translucent area 51 is provided in the area of the high resistance film 50 contacting the second low resistance area 81. Therefore, it becomes possible to suppress the optical absorption of the second translucent area 52. As a result, the light taking-out efficiency is enhanced and the luminance is increased, thereby making it possible to carry out the high quality display.

2. Modification 1

Figure 10:
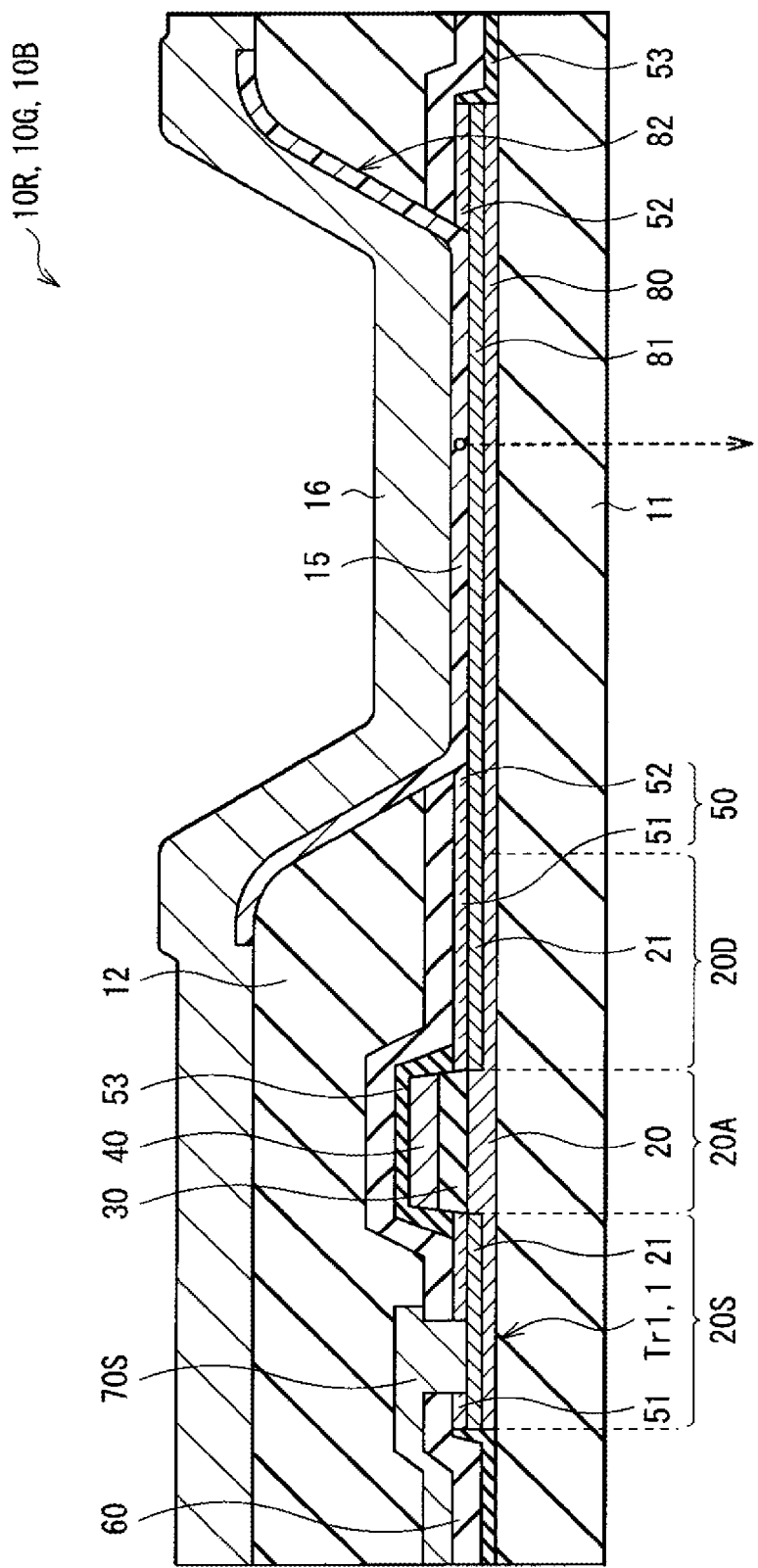
FIG. 10 is a cross sectional view showing a structure of a display device according to Modification 1 of the embodiment of the present disclosure.

FIG. 10 is a cross sectional view showing a structure of a display device according to Modification 1 of the embodiment of the present disclosure. In the display device, the first semiconductor oxide film 20 and the second semiconductor oxide film 80 are continuously provided. In this case, since the second semiconductor oxide film 80 has the second low resistance area 81 and thus the resistance thereof is low, the second semiconductor oxide film 80 can have a function as an electrode. Therefore, the second semiconductor oxide film 80 can be used as each of the first electrodes 13 of the organic electroluminescence elements 10R, 10G, and 10B. Except for this respect, the display device of Modification 1 of the embodiment has the same structure as that of the display device of the embodiment described above, and is identical in operation and effects to the display device of the embodiment described above.

Specifically, in the planarizing film 12, and the second translucent area 52 of the high resistance film 50, an opening portion 82 is provided in an area on the second low resistance area 81 of the second semiconductor oxide film 80. The second low resistance area 81 of the second semiconductor oxide film 80, and the organic layer 15 contact each other in the opening portion 82. Thus, a light is emitted from the area of the opening portion 82.

3. Modification 2

Figure 11:
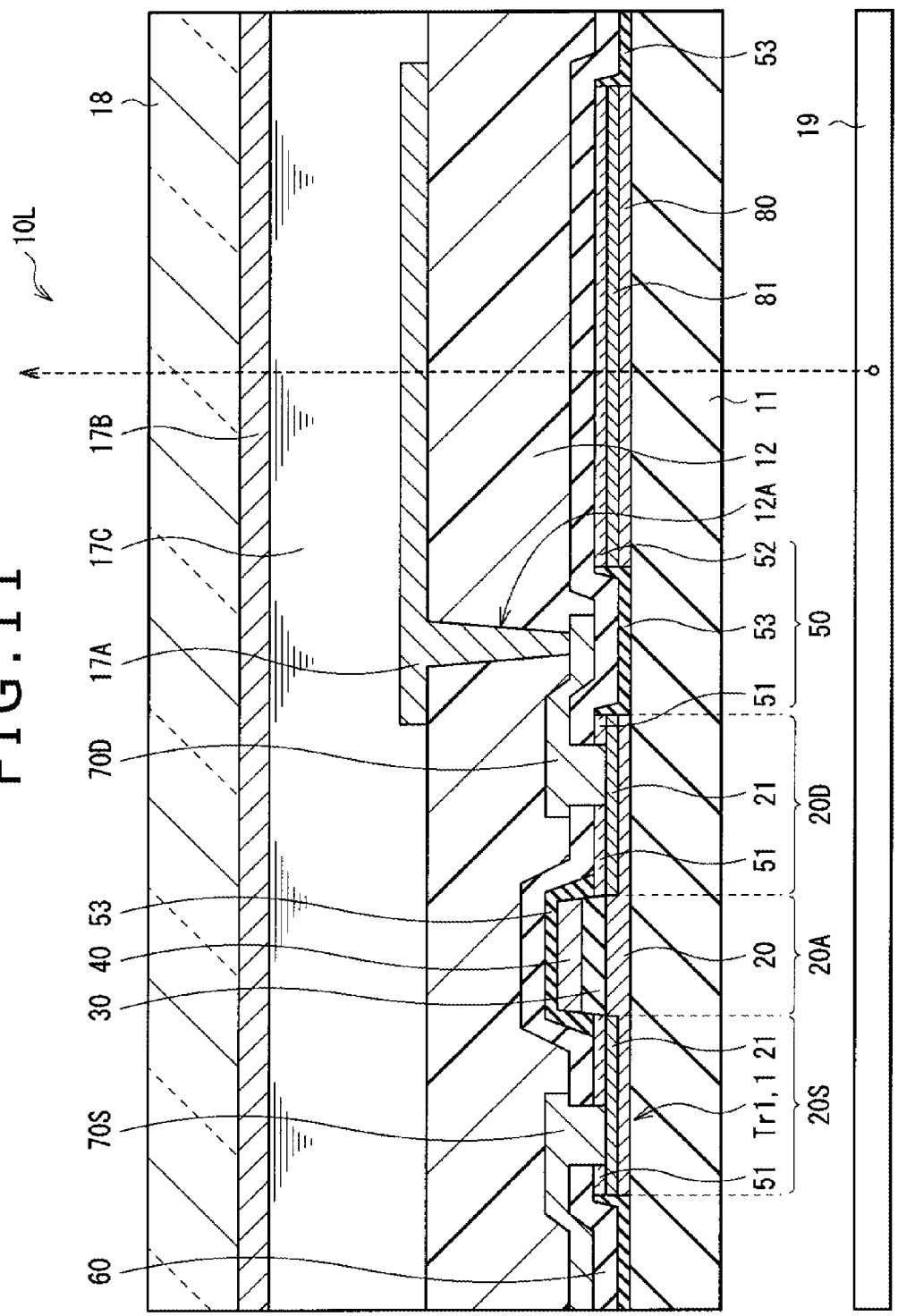
FIG. 11 is a cross sectional view showing a structure of a display device according to Modification 2 of the embodiment of the present disclosure.

FIG. 11 is a cross sectional view showing a structure of a display device according to Modification 2 of the embodiment of the present disclosure. The display device of Modification 2 of the embodiment has the same structure as that of the display device of the first embodiment described above, and is identical in operation and effects to the display device of the embodiment described above except that the display device of Modification 2 of the embodiment includes a liquid crystal display element 10L as a display element. Therefore, constituent elements corresponding to those in the display device of the embodiment are designated by the same reference numerals or symbols, respectively, for a description.

The liquid crystal display element 10L includes a pixel electrode 17A, for example, made of ITO on the planarizing layer 12. In addition, a common electrode 17B, for example, made of ITO is provided on a counter substrate 18. A liquid crystal layer 17C is provided between the pixel electrode 17A and the common electrode 17B. An illumination layer 19 serving as a backlight unit is provided on a back surface side of the substrate 11. A light emitted from the illumination layer 19 is transmitted through the substrate 11, the second semiconductor oxide film 80, and the second translucent area 52 of the high resistance film 50 to be made incident to the liquid crystal display element 10L.

In this case, the second semiconductor oxide film 80 is provided in the area, of the substrate 11, other than the area in which the thin film transistor 1 is provided, and the second translucent area 52 of the high resistance film 50 is provided so as to contact the second semiconductor oxide film 80. Therefore, the transmittance of the second translucent area 52 is increased. As a result, the transmittance about the light emitted from the illumination portion 19 is increased, and thus the luminance is enhanced.

It is noted that in Modification 2 as well, the first semiconductor oxide film 20 and the second semiconductor oxide film 80 can be continuously provided similarly to the case of Modification 1. In this case, the second semiconductor oxide film 80 can be used as one electrode of a subsidiary capacitor (not shown) connected to the liquid crystal element 10L.

4. Modification 3

Figure 12:
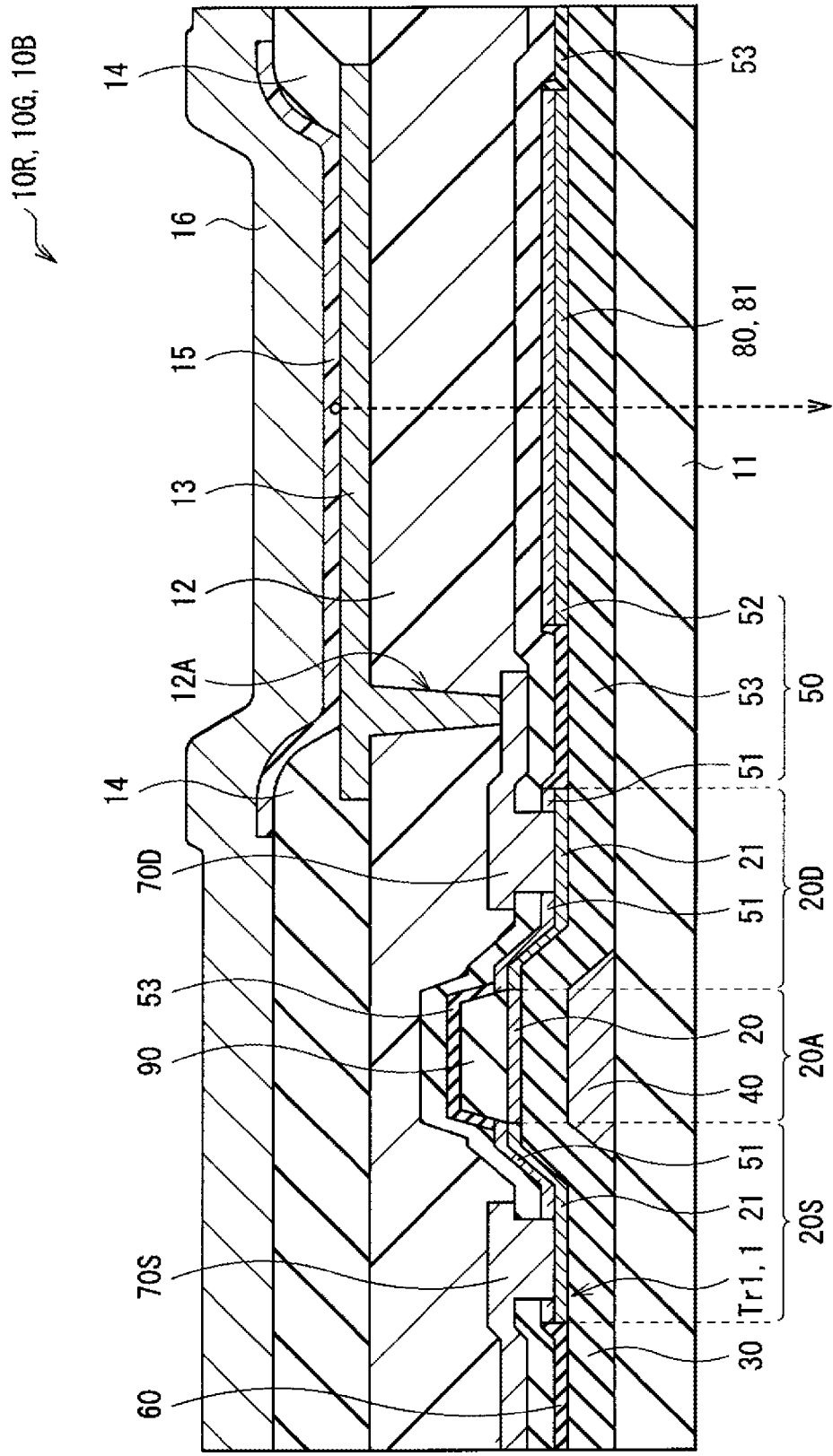
FIG. 12 is a cross sectional view showing a structure of a display device according to Modification 3 of the embodiment of the present disclosure.

FIG. 12 is a cross sectional view showing a structure of a display device according to Modification 3 of the embodiment of the present disclosure. In the display device of Modification 3 of the embodiment, a bottom-gate thin film transistor is used as the thin film transistor 1. That is to say, the thin film transistor 1 has a structure in which the gate electrode 40, the gate insulating film 30, the first semiconductor film 20, and a channel protecting film 90 are laminated in this order on the substrate 11. The channel protecting film 90 is provided on the channel region 20A of the first semiconductor film 20 and, for example, has a thickness of about 200 nm. Also, the channel protecting film 90 is formed from a single layer film of a silicon oxide film, a silicon nitride film or an aluminum oxide film, or a lamination film thereof. Except for this respect, the display device of Modification 3 of the embodiment has the same structure as that of the display device of the embodiment described above, and is identical in operation and effects to the display device of the embodiment described above.

5. Examples of Application

Module and Examples of Application

Hereinafter, a description will be given with respect to examples of application of the display device according to the embodiment of the present disclosure described above. The display device of the embodiment described above can be applied to the display devices, of electronic apparatuses in all the fields, in each of which a video signal inputted from the outside to the electronic apparatus, or a video signal generated in the electronic apparatus is displayed in the form of an image or a video image. In this case, the electronic apparatuses include a television set, a digital camera, a notebook-size personal computer, mobile terminal equipment such as a mobile phone, and a video camera.

(Module)

Figure 13:
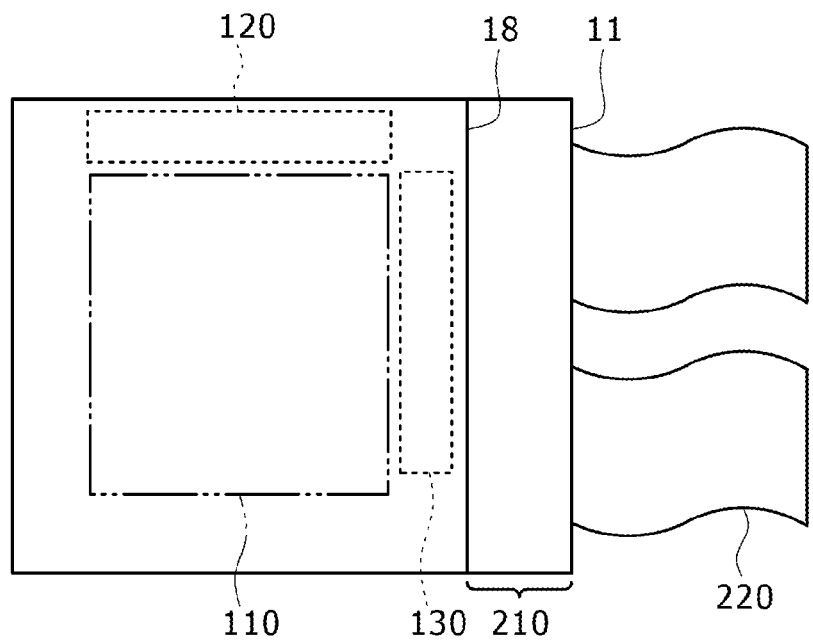
FIG. 13 is a top plan view showing a module-shaped display device in the form of which the display device shown in FIG. 1 is incorporated in various electronic apparatuses.

The display device of the embodiment described above is incorporated as a module, for example, as shown in FIG. 13, in various kinds of electronic apparatuses exemplified as first to fifth examples of application which will be described later. In the module, for example, an area 210 exposed either from the encapsulating substrate (not shown) in the embodiment or from the counter substrate 18 in Modification 2 of the embodiment is provided in one side of the substrate 11, and wirings of the signal line driving circuit 120 and the scanning driving circuit 130 are made to extend to form external connection terminals (not shown) in the exposed area 210. A Flexible Printed Circuit (FPC) board 220 for input/output of the signals may be provided in those external connection terminals.

First Examples of Application

Figure 14:
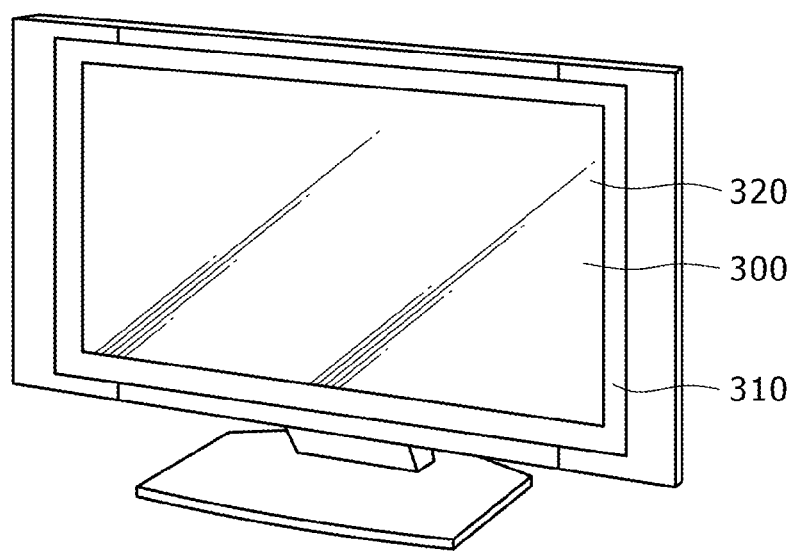
FIG. 14 is a perspective view of a television set as a first example of application to which the display device shown in FIG. 1 is applied.

FIG. 14 is a perspective view showing an external appearance of a television set as a first example of application to which the display device of the embodiment is applied. The television set, for example, includes an image display screen portion 300 composed of a front panel 310 and a filter glass 320. In this case, the image display screen portion 300 is composed of the display device of the embodiment described above.

Second Example of Application

Figure 15A:
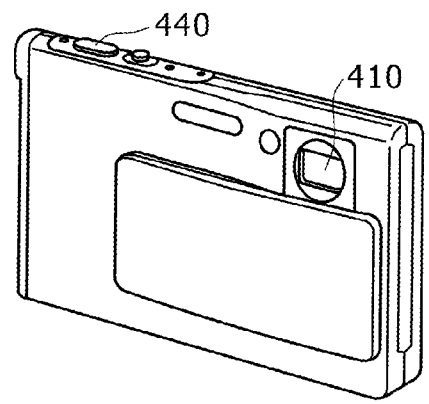
FIGS. 15A and 15B are respectively a perspective view of a digital camera as a second example of application, when viewed from a front side, to which the display device shown in FIG. 1 is applied, and a perspective view of the digital camera as the second example of application, when viewed from a back side, to which the display device shown in FIG. 1 is applied.
Figure 15B:
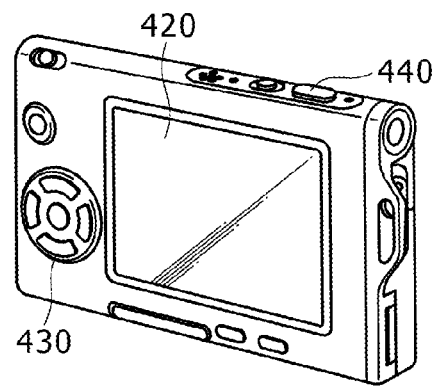

FIGS. 15A and 15B are respectively perspective views showing respective external appearances of a digital camera as a second example of application to which the display device of the embodiment descried above is applied. The digital camera, for example, includes a light emitting portion 410 for flash, a display portion 420, a menu switch 430, and a shutter button 440. In this case, the display portion 420 is composed of the display device of the embodiment described above.

Third Example of Application

Figure 16:
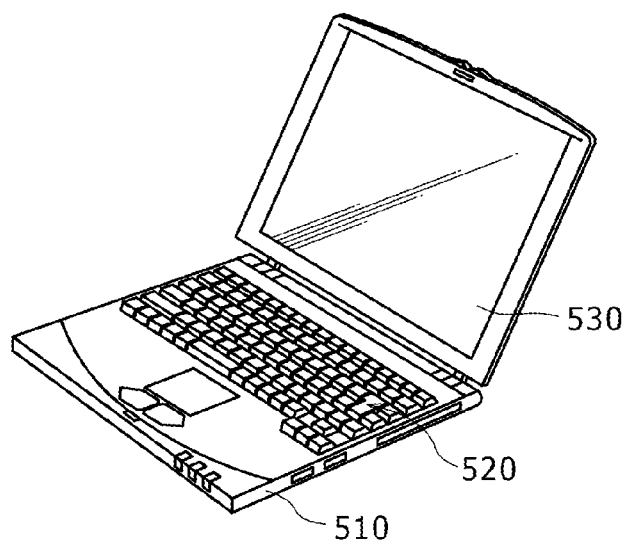
FIG. 16 is a perspective view showing a notebook-size personal computer as a third example of application to which the display device shown in FIG. 1 is applied.

FIG. 16 is a perspective view showing an external appearance of a notebook-size personal computer as a third example of application to which the display device of the embodiment described above is applied. The notebook-size personal computer, for example, includes a main body 510, a keyboard 520 which is manipulated when characters or the like are inputted, and a display portion 530 for displaying thereon an image. In this case, the display portion 530 is composed of the display device of the embodiment described above.

Fourth Example of Application

Figure 17:
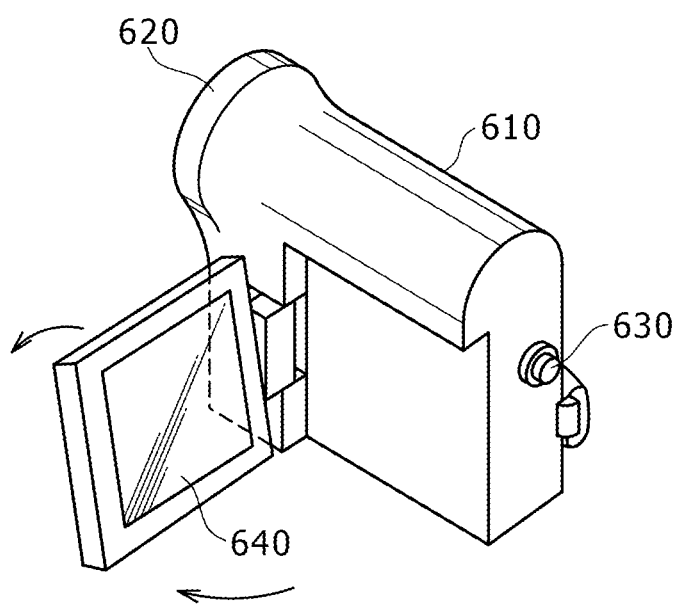
FIG. 17 is a perspective view showing a video camera as a fourth example of application to which the display device shown in FIG. 1 is applied.

FIG. 17 is a perspective view showing an external appearance of a video camera as a fourth example of application to which the display device of the embodiment described above is applied. The video camera, for example, includes a main body portion 610, a lens 620 which captures an image of a subject and which is provided on a side surface directed forward, a start/stop switch 630 which is operated when an image of a subject is captured, and a display portion 640. In this case, the display portion 640 is composed of the display device of the embodiment described above.

Fifth Example of Application

FIGS. 18A to 18G are respectively views showing respective external appearances of a mobile phone as a fifth example of application to which the display device of the embodiment described above is applied. The mobile phone, for example, is constructed in such a way that an upper chassis 710 and a lower chassis 720 are coupled to each other through a coupling portion (hinge portion) 730. The mobile phone, for example, includes a display portion 740, a sub-display portion 750, a picture light 760, and a camera 770 in addition to the upper chassis 710, the lower chassis 720, and the coupling portion (hinge portion) 730. In this case, of these constituent elements, either the display portion 740 or the sub-display portion 750 is composed of the display device of the embodiment described above.

Although the present disclosure has been described so far by giving the embodiments, the present disclosure is by no means limited to the embodiments described above, and various kinds of changes can be made. For example, in each of the embodiments described above, the description has been given with respect to the case where the low resistance areas 21 are provided in the parts of the source region 20S and the drain region 20D in the depth direction from the upper surfaces of the source region 20S and the drain region 20D, respectively.

Figure 19:
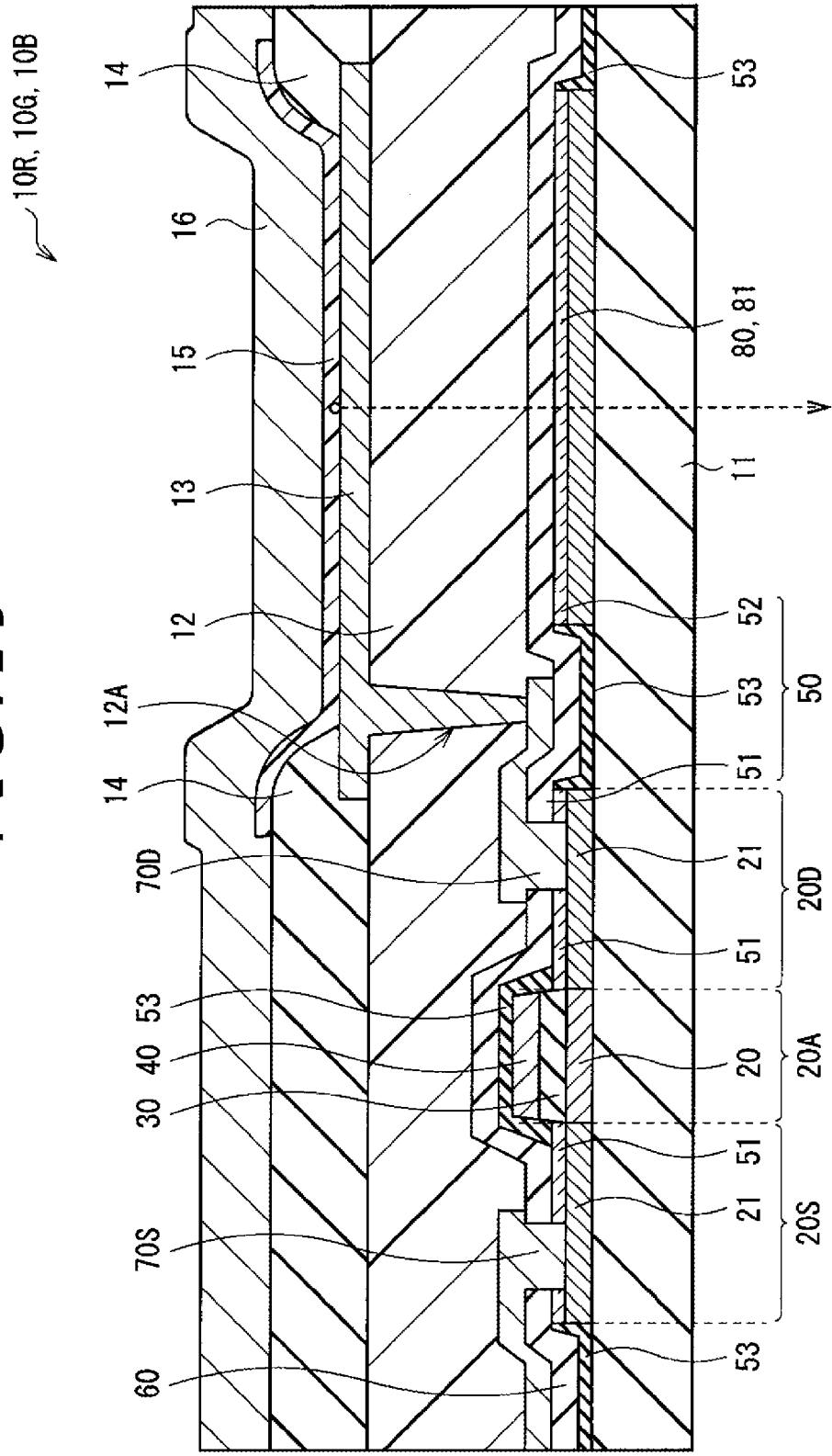
FIG. 19 is a cross sectional view showing modifications of a thin film transistor shown in FIG. 3.

However, it is only necessary to provide the low resistance areas 21 in at least the parts of the source region 20S and the drain region 20D in the depth direction from the upper surfaces of the source region 20S and the drain region 20D, respectively. For example, as shown in FIG. 19, the first low resistance areas 21 may also be provided entirely in the source region 20S and the drain region 20D in the depth direction from the upper surfaces of the source region 20S and the drain region 20D, respectively.

In addition, for example, in each of the embodiments described above, the description has been given with respect to the case where the first semiconductor oxide film 20 and the second semiconductor oxide film 80 are each directly provided on the substrate 11. However, the first semiconductor oxide film 20 and the second semiconductor oxide film 80 may also be each provided on the substrate 11 through an insulating film such as a silicon oxide film, a silicon nitride film or an aluminum oxide film. As a result, it is possible to prevent the impurity and moisture from being diffused from the substrate 11 into the first semiconductor oxide film 20.

Moreover, for example, the materials and thicknesses, or the deposition methods and the deposition conditions of the layers described in the above embodiments are by no means limited, and thus any other suitable material and thickness may also be adopted, and any other suitable deposition method and deposition condition may also be adopted.

In addition thereto, the present disclosure can also be applied to display devices using other display elements such as an inorganic electroluminescence element, or an electro-deposition type or electrochromic type display element in addition to the liquid crystal display device and the organic EL display device.

It should be noted that the technique according to the present disclosure can also adopt configurations as will be described above.

(1) A display device including: a substrate; a display element provided on the substrate; a thin film transistor provided on the substrate, and having a first semiconductor oxide film including a source region and a drain region on both sides of a channel region, the first semiconductor oxide film having first low resistance areas each of whose oxygen concentration is lower than that of said channel region in at least parts of the source region and said drain region in a depth direction from upper surfaces of the source region and the drain region; a second semiconductor oxide film provided in an area, of the substrate, other than the area in which the thin film transistor is provided, and having a second low resistance area whose oxygen concentration is lower than that of the channel region in at least a part in the depth direction from the upper surface; and a high resistance film covering the thin film transistor, the second semiconductor oxide film, and the substrate, made of a metallic oxide, having a first translucent area in an area contacting the first low resistance area, and having a second translucent area in an area contacting the second low resistance area.

(2) The display device according to a paragraph (1), in which each of the first translucent area and the second translucent area is formed from an aluminum oxide film.

(3) The display device according to the paragraph (1) or (2), in which the first semiconductor oxide film and the second semiconductor oxide film are continuously formed.

(4) The display device according to any one of the paragraph (1) to (3), in which the first semiconductor oxide film is provided on the substrate;
a gate insulating film and a gate electrode are provided in this order on the channel region of the first semiconductor oxide film so as to have the same shape;

the high resistance film and an interlayer insulating film are provided in this order on a surface of the first semiconductor oxide film, the gate insulating film, and the gate electrode; and a source electrode and a drain electrode are connected to the first low resistance areas through connection holes, provided in the interlayer insulating film and the high resistance film.

(5) The display device according to any one of the paragraph (1) to (4), in which the display element is an organic electroluminescence element having a first electrode, an organic layer including a light emitting layer, and a second electrode in this order from the substrate side, and a light emitted from the organic electroluminescence element is transmitted through the second translucent area to be taken out from the side of the substrate.

(6) The display device according to any one of the paragraph (1) to (4), in which the display element is a liquid crystal display element;

an illumination portion is provided on a back surface side of the substrate; and a light emitted from the illumination portion is transmitted through the second translucent area to be made incident to the liquid crystal display element.

(7) An electronic apparatus including a display device having a substrate, a display element provided on the substrate, a thin film transistor provided on the substrate, and having a first semiconductor oxide film including a source region and a drain region on both sides of a channel region, the first semiconductor oxide film having first low resistance areas each of whose oxygen concentration is lower than that of the channel region in at least parts of the source region and the drain region in a depth direction from upper surfaces of the source region and said drain region, a second semiconductor oxide film provided in an area, of the substrate, other than the area in which the thin film transistor is provided, and having a second low resistance area whose oxygen concentration is lower than that of the channel region in at least a part in the depth direction from the upper surface; and a high resistance film covering the thin film transistor, the second semiconductor oxide film, and the substrate, made of a metallic oxide, having a first translucent area in an area contacting the first low resistance area, and having a second translucent area in an area contacting the second low resistance area.

The present disclosure contains subject matter related to that disclosed in Japanese Priority Patent Application JP 2011-042108 filed in the Japan Patent Office on Feb. 28, 2011, the entire content of which is hereby incorporated by reference.

What is claimed is:

1. A display device, comprising:
a substrate;
a display element provided on said substrate;
a thin film transistor provided on said substrate, and having
a first semiconductor oxide film including a source region and a drain region on both sides of a channel region, said first semiconductor oxide film having first low resistance areas each of whose oxygen concentration is lower than that of said channel region in at least parts of said source region and said drain region in a depth direction from upper surfaces of said source region and said drain region;
a second semiconductor oxide film provided in an area, of said substrate, other than the area in which said thin film transistor is provided, and having a second low resistance area whose oxygen concentration is lower than that of said channel region in at least a part in the depth direction from the upper surface; and a high resistance film covering said thin film transistor, said second semiconductor oxide film, and said substrate, made of a metallic oxide, having a first translucent area in an area contacting said first low resistance area, and having a second translucent area in an area contacting said second low resistance area.

2. The display device according to claim 1, wherein each of said first translucent area and said second translucent area is formed from an aluminum oxide film.

3. The display device according to claim 1, wherein said first semiconductor oxide film and said second semiconductor oxide film are continuously formed.

4. The display device according to claim 1, wherein
said first semiconductor oxide film is provided on said substrate,
a gate insulating film and a gate electrode are provided in this order on said channel region of said first semiconductor oxide film so as to have the same shape,
said high resistance film and an interlayer insulating film are provided in this order on a surface of said first semiconductor oxide film, said gate insulating film, and said the gate electrode, and
a source electrode and a drain electrode are connected to said first low resistance areas through connection holes, provided in said interlayer insulating film and said high resistance film.

5. The display device according to claim 1, wherein
said display element is an organic electroluminescence element having a first electrode, an organic layer including a light emitting layer, and a second electrode in this order from the substrate side, and a light emitted from said organic electroluminescence element is transmitted through said second translucent area to be taken out from the side of said substrate.

6. The display device according to claim 1, wherein
said display element is a liquid crystal display element,
an illumination portion is provided on a back surface side of said substrate, and
a light emitted from said illumination portion is transmitted through said second translucent area to be made incident to said liquid crystal display element.

7. An electronic apparatus, comprising:
a display device including
a substrate,
a display element provided on said substrate,
a thin film transistor provided on said substrate, and having a first semiconductor oxide film including a source region and a drain region on both sides of a channel region, said first semiconductor oxide film having first low resistance areas each of whose oxygen concentration is lower than that of said channel region in at least parts of said source region and said drain region in a depth direction from upper surfaces of said source region and said drain region,
a second semiconductor oxide film provided in an area, of said substrate, other than the area in which said thin film transistor is provided, and having a second low resistance area whose oxygen concentration is lower than that of said channel region in at least a part in the depth direction from the upper surface, and
a high resistance film covering said thin film transistor, said second semiconductor oxide film, and said substrate, made of a metallic oxide, having a first translucent area in an area contacting said first low resistance area, and having a second translucent area in an area contacting said second low resistance area.

* * * * *